(12) United States Patent
Rusli et al.

(10) Patent No.: US 8,176,628 B1
(45) Date of Patent: May 15, 2012

(54) PROTRUDING POST SUBSTRATE PACKAGE STRUCTURE AND METHOD

(75) Inventors: Sukianto Rusli, Phoenix, AZ (US); Ronald Patrick Huemoeller, Chandler, AZ (US); David Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 598 days.

(21) Appl. No.: 12/342,839

(22) Filed: Dec. 23, 2008

(51) Int. Cl.
 *H01K 3/10* (2006.01)
(52) U.S. Cl. ........ 29/852; 427/97.4; 427/97.7; 205/125; 174/261; 361/777; 257/774
(58) Field of Classification Search .................... 29/852, 29/853; 427/97.4, 97.7–98.3; 205/125; 174/261, 174/262, 264, 266; 361/777, 778; 257/774, 257/776
See application file for complete search history.

(56) References Cited

U.S. PATENT DOCUMENTS

| | | | |
|---|---|---|---|
| 5,231,751 A * | 8/1993 | Sachdev et al. ................ | 29/852 |
| 6,194,250 B1 | 2/2001 | Melton et al. | |
| 6,423,643 B1 | 7/2002 | Furuhata et al. | |
| 6,730,857 B2 | 5/2004 | Konrad et al. | |
| 6,740,964 B2 | 5/2004 | Sasaki | |
| 6,919,514 B2 | 7/2005 | Konrad et al. | |
| 7,242,081 B1 | 7/2007 | Lee | |
| 7,345,361 B2 | 3/2008 | Mallik et al. | |
| 7,372,151 B1 | 5/2008 | Fan et al. | |
| 2003/0155638 A1 * | 8/2003 | Ito ................................. | 257/678 |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

FOREIGN PATENT DOCUMENTS

| | | | |
|---|---|---|---|
| JP | 06-302965 | * | 10/1994 |
| JP | 2002-314028 | * | 10/2002 |

OTHER PUBLICATIONS

Berry et al., "Thin Stacked Interposer Package", U.S. Appl. No. 11/865,617, filed Oct. 1, 2007.
Scanlan, "Package-on-package (PoP) with Through-mold Vias", *Advanced Packaging*, Jan. 2008, 3 pages, vol. 17, Issue 1, PennWell Corporation.
Kim et al., "Application of Through Mold Via (TMV) as PoP base package", *58th ECTC Proceedings*, May 2008, Lake Buena Vista, FL, 6 pages, IEEE.

* cited by examiner

*Primary Examiner* — A. Dexter Tugbang
*Assistant Examiner* — Jeffrey T Carley
(74) *Attorney, Agent, or Firm* — McKay and Hodgson, LLP; Serge J. Hodgson

(57) ABSTRACT

In accordance with one embodiment, a method of forming a protruding post substrate package includes applying a dielectric layer to a carrier. Via apertures are formed in the dielectric layer. Carrier cavities are formed in the carrier using the dielectric layer as a mask. The carrier cavities are lined with a first metal, the first metal being selectively etchable compared to the carrier. After encapsulation of an electronic component with an encapsulant, the carrier is removed such that protruding posts including the first metal protrude outward from a first surface of the dielectric layer.

12 Claims, 18 Drawing Sheets

PROTRUDING POST SUBSTRATE PACKAGE STRUCTURE AND METHOD

BACKGROUND OF THE INVENTION

1. Field of the Invention

The present application relates to the field of electronics, and more particularly, to methods of forming electronic component packages and related structures.

2. Description of the Related Art

Typically, the final operation in the preparation of a Ball Grid Array (BGA) package is the solder ball attach operation. The solder balls are distributed in an array thus forming the BGA package. The solder balls are ref lowed to attach the BGA package to a larger substrate such as a printed circuit motherboard.

As the pitch of the solder balls is increasingly reduced as the art moves towards smaller and thinner BGA packages, solder ball registration with the respective lands becomes increasingly difficult. Accordingly, use of solder balls becomes increasingly complex thus increasing the cost of the overall BGA package, as well as reducing reliability.

Further, as the art moves towards smaller and thinner BGA packages, BGA package warpage becomes increasing prevalent. BGA package warpage can result in defective interconnection with fine pitch solder balls.

SUMMARY OF THE INVENTION

In accordance with one embodiment, a method of forming a protruding post substrate package includes applying a dielectric layer to a carrier. Via apertures are formed in the dielectric layer. Carrier cavities are formed in the carrier using the dielectric layer as a mask. The carrier cavities are lined with a first metal, the first metal being selectively etchable compared to the carrier. After encapsulation of an electronic component with an encapsulant, the carrier is removed such that protruding posts including the first metal protrude outward from a first surface of the dielectric layer.

The carrier is formed of a relative rigid material. Accordingly, the carrier provides rigidity and strength thus ensuring that the protruding post substrate package remains flat, i.e., has an absence of warpage or bending, during fabrication. Once the encapsulant is formed, the encapsulant provides the rigidity and strength for the protruding post substrate package thus allowing the carrier to be removed while at the same time preventing warpage or bending of the protruding post substrate package.

Further, the protruding posts provide the interconnection structure for electrical and physical mounting of the protruding post substrate package to a larger substrate such as a printed circuit motherboard. The protruding posts can be reliably formed with an extremely fine pitch.

These and other features of the present invention will be more readily apparent from the detailed description set forth below taken in conjunction with the accompanying drawings.

DETAILED DESCRIPTION

Figure 2:
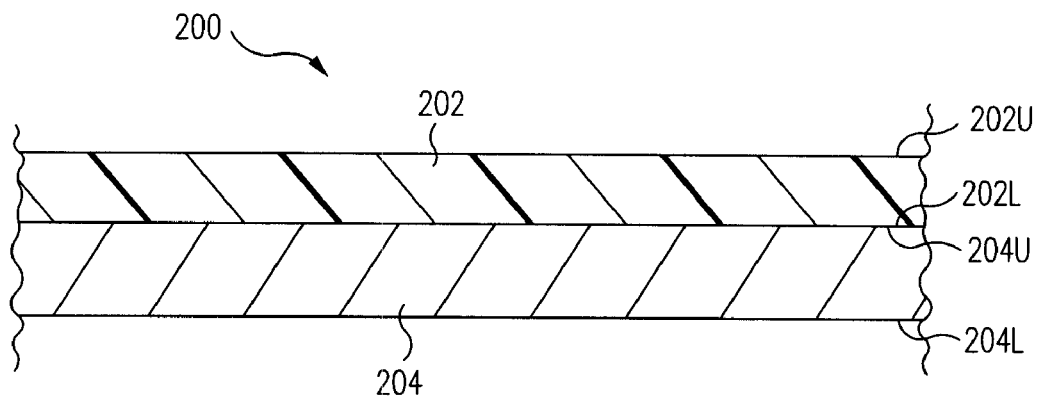
FIG. 2 is a cross-sectional view of a protruding post substrate package during fabrication in accordance with one embodiment.
Figure 3:
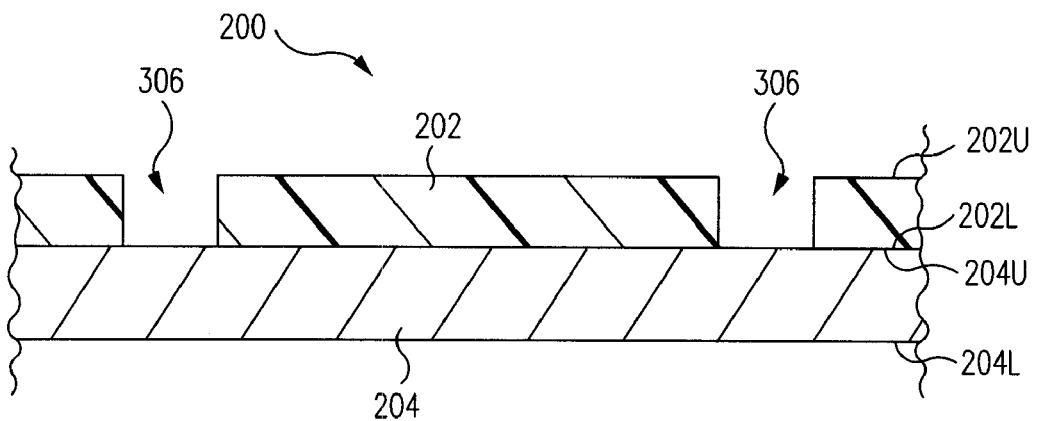
FIGS. 3, 4, 5, 6, 7, 8, 9, 10, 11, 12 are cross-sectional views of the protruding post substrate package of FIG. 2 at later stages during fabrication in accordance with one embodiment.
Figure 4:
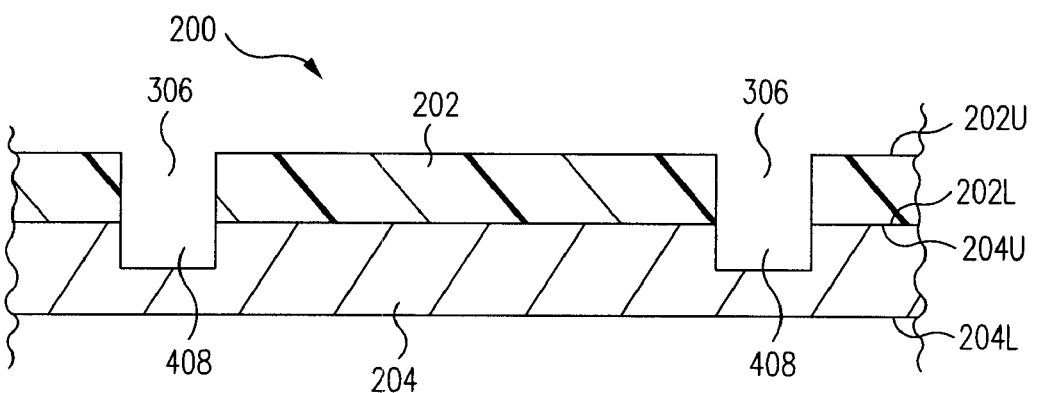
Figure 5:
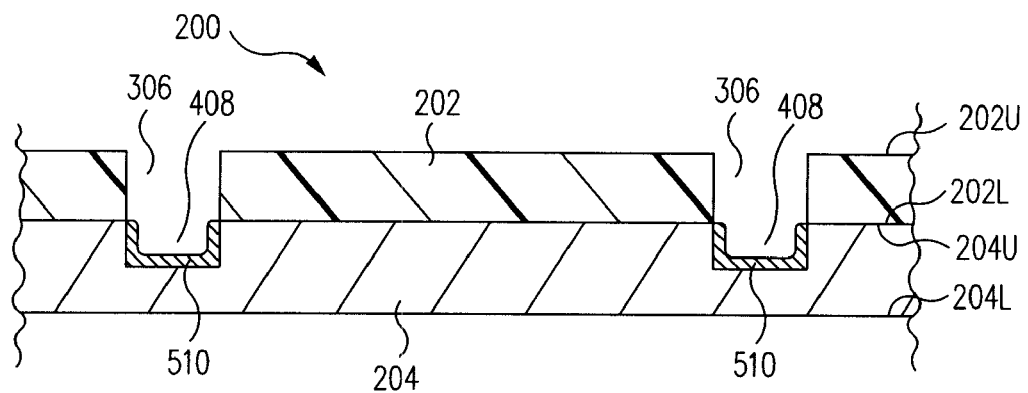
Figure 21:
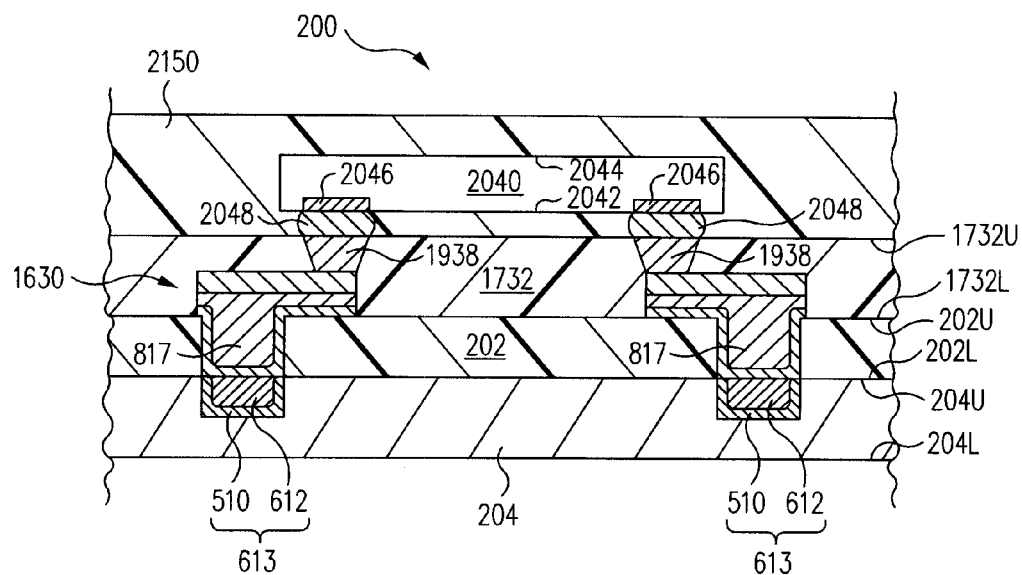
Figure 22:
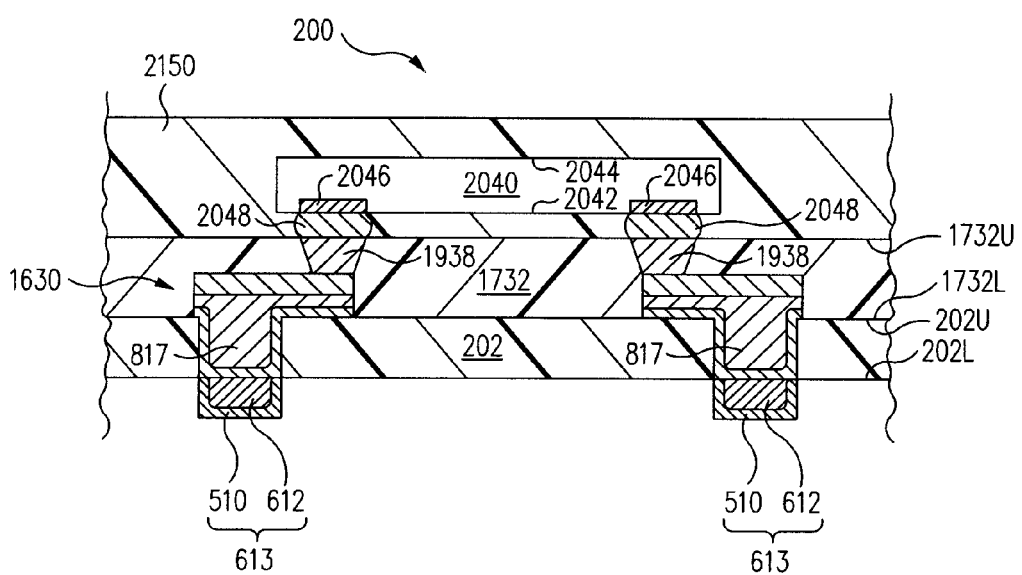

As an overview, in accordance with one embodiment, a method of forming a protruding post substrate package 200 includes applying a dielectric layer 202 to a carrier 204 as illustrated in FIG. 2. Referring to FIG. 3, via apertures 306 are formed in dielectric layer 202. Referring to FIG. 4, carrier cavities 408 are formed in carrier 204 using dielectric layer 202 as a mask. Referring now to FIG. 5, carrier cavities 408 are lined with a first metal 510, first metal 510 being selectively etchable compared to carrier 204. Referring now to FIGS. 21 and 22 together, after encapsulation of an electronic component 2040 with an encapsulant 2150, carrier 204 is removed such that protruding posts 613 including first metal 510 protrude outward from a first surface 202L of dielectric layer 202.

Carrier 204 is formed of a relative rigid material. Accordingly, carrier 204 provides rigidity and strength thus ensuring that protruding post substrate package 200 remains flat, i.e., has an absence of warpage or bending, during fabrication. Once encapsulant 2150 is formed, encapsulant 2150 provides the rigidity and strength for protruding post substrate package 200 thus allowing carrier 204 to be removed while at the same time preventing warpage or bending of protruding post substrate package 200.

Further, protruding posts 613 provide the interconnection structure for electrical and physical mounting of protruding post substrate package 200 to a larger substrate such as a printed circuit motherboard. Protruding posts 613 can be reliably formed with an extremely fine pitch.

Figure 1:
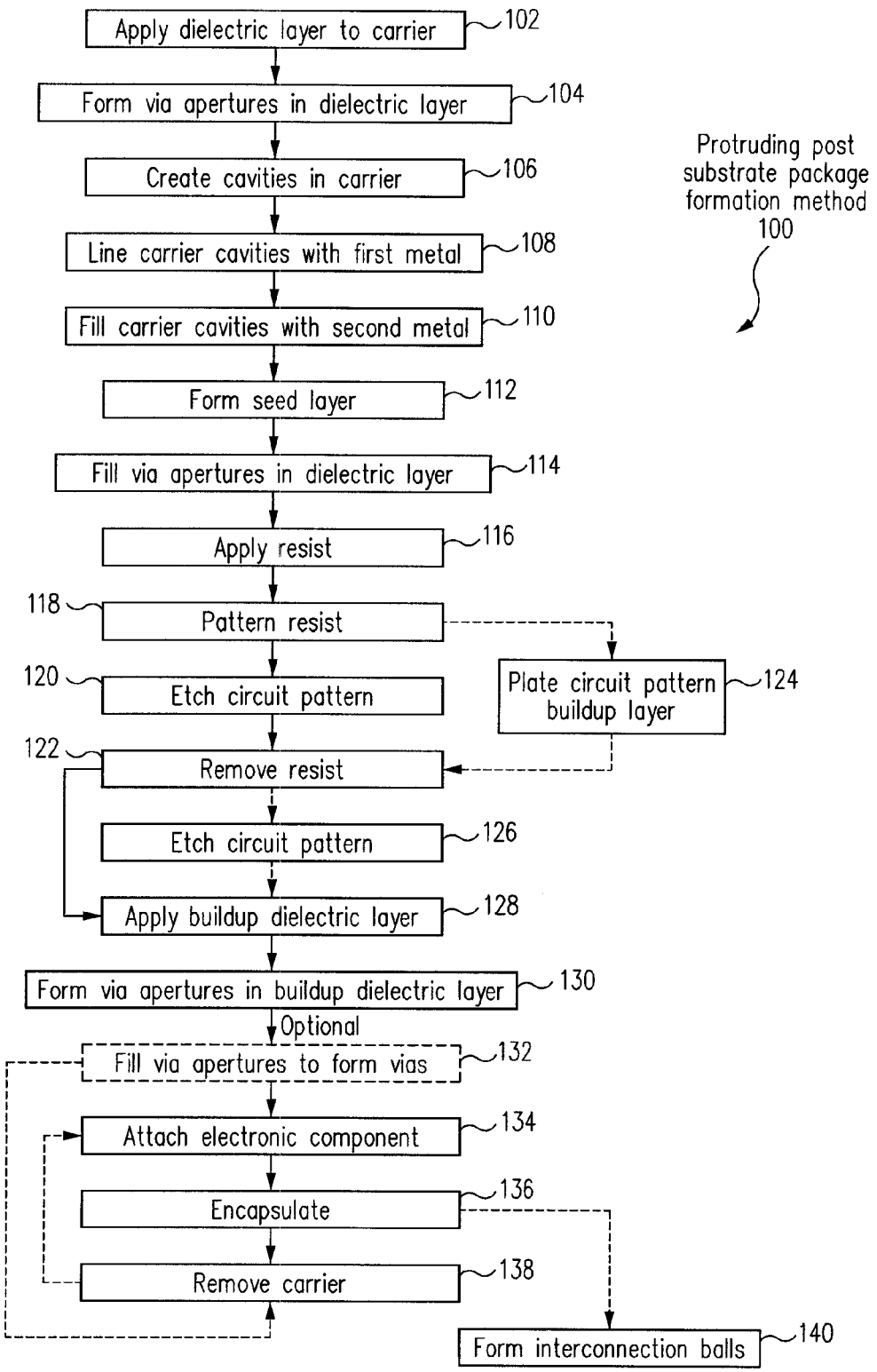
FIG. 1 is a protruding post substrate package formation method in accordance with one embodiment.

More particularly, FIG. 1 is a protruding post substrate package formation method 100 in accordance with one embodiment. FIG. 2 is a cross-sectional view of a protruding post substrate package 200 during fabrication in accordance with one embodiment. Referring now to FIGS. 1 and 2 together, in an apply dielectric layer to carrier operation 102, a dielectric layer 202 is applied, e.g., laminated, to a carrier 204.

Carrier 204 is an electrically conductive material, e.g., copper, although is formed of other conductive materials in other embodiments. Carrier 204 includes a first surface 204U and an opposite second surface 204L.

Dielectric layer 202 is a layer of dielectric, e.g., dielectric tape, dielectric film, adhesive, or other dielectric. A first surface 202L of dielectric layer 202 is attached to first surface 204U of carrier 204. Dielectric layer 202 further includes an opposite second surface 202U.

FIG. 3 is a cross-sectional view of protruding post substrate package 200 of FIG. 2 at a later stage during fabrication in accordance with one embodiment. Referring now to FIGS. 1 and 3 together, from apply dielectric layer to carrier operation 102, flow moves to a form via apertures in dielectric layer operation 104. In form via apertures in dielectric layer operation 104, via apertures 306 are formed, e.g., using laser-ablation, mechanical drilling, chemical etching, or other via aperture formation technique, in dielectric layer 202. Via apertures 306 extend entirely through dielectric layer 202 from second surface 202U to first surface 202L and to carrier 204. Accordingly, portions of first surface 204U of carrier 204 are exposed through via apertures 306.

FIG. 4 is a cross-sectional view of protruding post substrate package 200 of FIG. 3 at a later stage during fabrication in accordance with one embodiment. Referring now to FIGS. 1 and 4 together, from form via apertures in dielectric layer operation 104, flow moves to a create cavities in carrier operation 106. In create cavities in carrier operation 106, carrier cavities 408 are created in carrier 204, and, more particularly, in first surface 204U of carrier 204.

Carrier cavities 408 extend partially into carrier 204 such that portions of carrier 204 remaining between carrier cavities 408 and second surface 204L of carrier 204. In one embodiment, carrier cavities 408 are etched, sometimes called chemically milled, into carrier 204 using dielectric layer 202 as a mask. More particularly, the portions of carrier 204 exposed through via apertures 306 are etched through via apertures 306. Accordingly, carrier cavities 408 are self-aligned with via apertures 306.

FIG. 5 is a cross-sectional view of protruding post substrate package 200 of FIG. 4 at a later stage during fabrication in accordance with one embodiment. Referring now to FIGS. 1 and 5 together, from create cavities in carrier operation 106, flow moves to a line carrier cavities with first metal operation 108. In line carrier cavities with first metal operation 108, carrier cavities 408 in carrier 204 are lined with a first metal 510, e.g., by plating first metal 510.

In one embodiment, first metal 510 is formed of an etch stop metal, e.g., nickel, tin, gold, or palladium that is selectively etchable compared to carrier 204, e.g., copper. This facilitates etch removal of carrier 204 as discussed below in a remove carrier operation 138. In one embodiment, carrier 204 is copper and is removed using a copper etch process as the carrier etch process. During this copper etch process, first metal 510 provide an etch stop for the copper etch process.

In one embodiment, an etch stop is an etch process end point. To illustrate, the copper etch process is performed until carrier 204 is completely removed, which is the process end point. More particularly, upon complete removal of carrier 204, first metal 510 becomes exposed and prevents further etching during the copper etch process.

Figure 6:
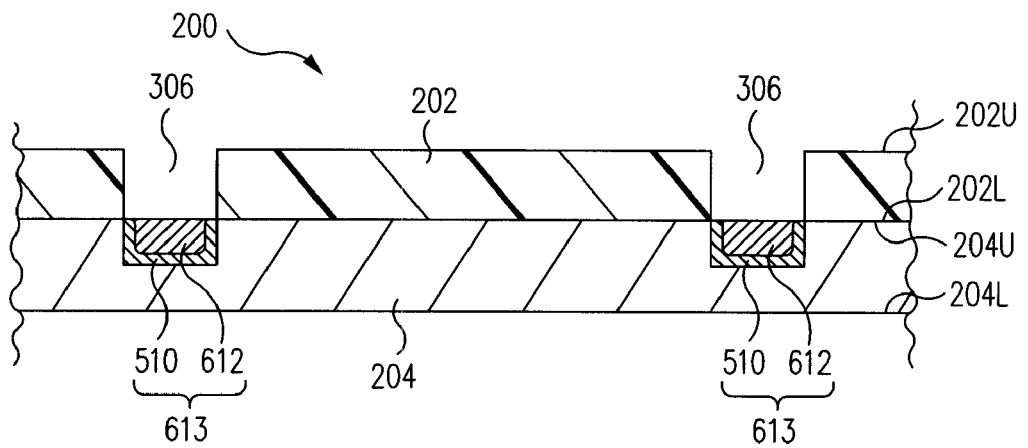

FIG. 6 is a cross-sectional view of protruding post substrate package 200 of FIG. 5 at a later stage during fabrication in accordance with one embodiment. Referring now to FIGS. 1, 5 and 6 together, from line carrier cavities with first metal operation 108, flow moves to a fill carrier cavities with second metal operation 110. In fill carrier cavities with second metal operation 110, carrier cavities 408 in carrier 204 are filled with a second metal 612, e.g., copper. In one embodiment, carrier cavities 408 in carrier 204 are button plated with copper.

As illustrated in FIG. 6, after performance of fill carrier cavities with second metal operation 110, carrier cavities 408 are lined with first metal 510 and filled with second metal 612. First metal 510 and second metal 612 form protruding posts 613 as discussed further below. More particularly, the exterior surfaces of protruding posts 613 are formed by first metal 510 and second metal 612 is encased within first metal 510.

Figure 7:
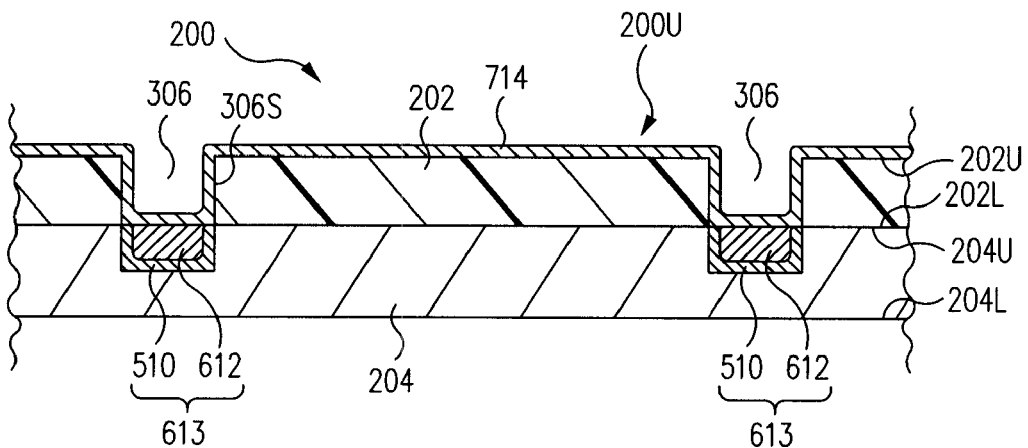

FIG. 7 is a cross-sectional view of protruding post substrate package 200 of FIG. 6 at a later stage during fabrication in accordance with one embodiment.

Referring now to FIGS. 1 and 7 together, from fill carrier cavities with second metal operation 110, flow moves to a form seed layer operation 112. In form seed layer operation 112, a seed layer 714, e.g., copper or other electrically conductive material, is formed. In one embodiment, seed layer 714 is an electroless copper seed layer.

Seed layer 714 is a relatively thin blanket layer that is formed over the entire second surface 202U of dielectric layer 202, on sidewalls 306S of via apertures 306, and on second metal 612. Generally, seed layer 714 entirely covers a first surface 200U of protruding post substrate package 200.

Figure 8:
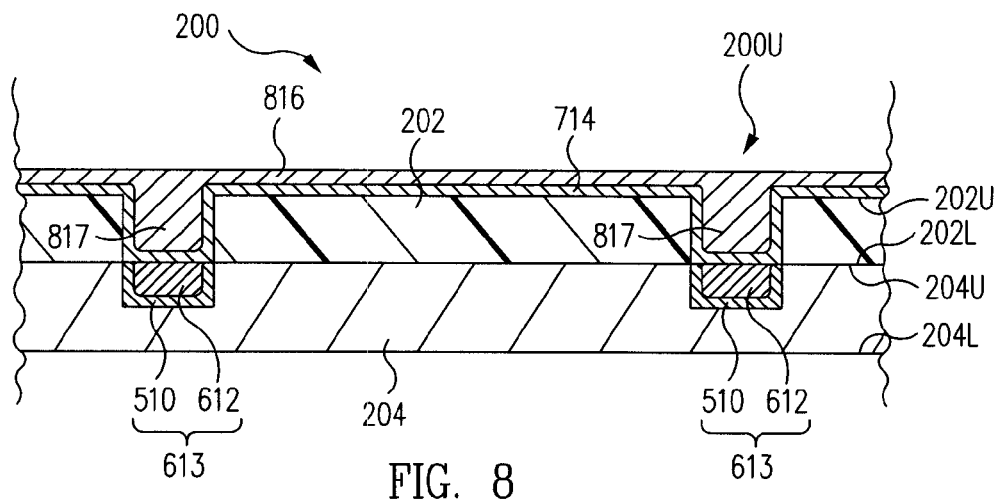

FIG. 8 is a cross-sectional view of protruding post substrate package 200 of FIG. 7 at a later stage during fabrication in accordance with one embodiment. Referring now to FIGS. 1, 7 and 8 together, from form seed layer operation 112, flow moves to a fill via apertures in dielectric layer operation 114. In fill via apertures in dielectric layer operation 114, via apertures 306 in dielectric layer 202 are filled with a circuit pattern metal 816.

Circuit pattern metal 816 within via apertures 306 forms electrically conductive vias 817 extending through dielectric layer 202. Vias 817 are electrically connected to protruding posts 613 at first surface 202L of dielectric layer 202.

Further, circuit pattern metal 816 entirely covers seed layer 714. Generally, circuit pattern metal 816 entirely covers first surface 200U of protruding post substrate package 200.

Figure 9:
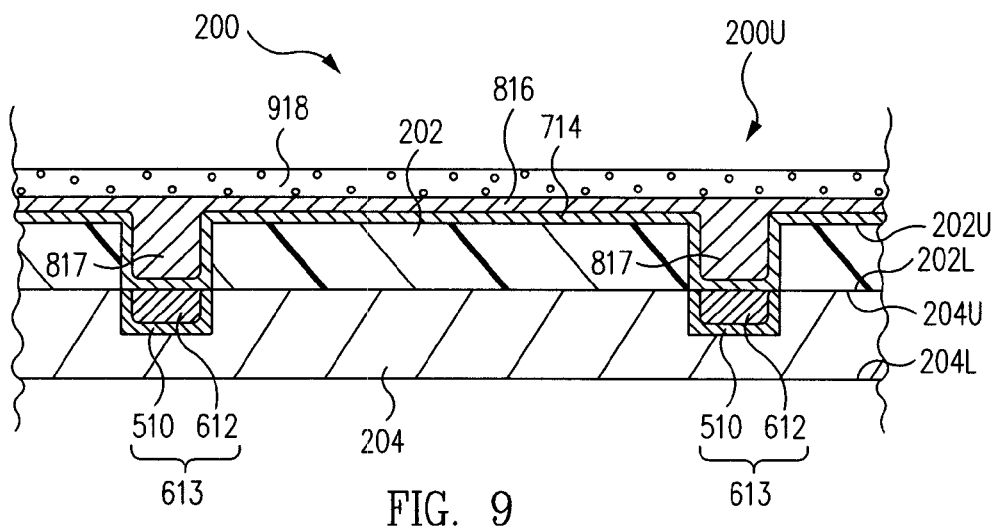

FIG. 9 is a cross-sectional view of protruding post substrate package 200 of FIG. 8 at a later stage during fabrication in accordance with one embodiment. Referring now to FIGS. 1 and 9 together, from fill via apertures in dielectric layer operation 114, flow moves to an apply resist operation 116. In apply resist operation 116, a resist 918, e.g., photoresist, is applied on circuit pattern metal 816. Resist 918 entirely covers circuit pattern metal 816 and generally covers first surface 200U of protruding post substrate package 200.

Figure 10:
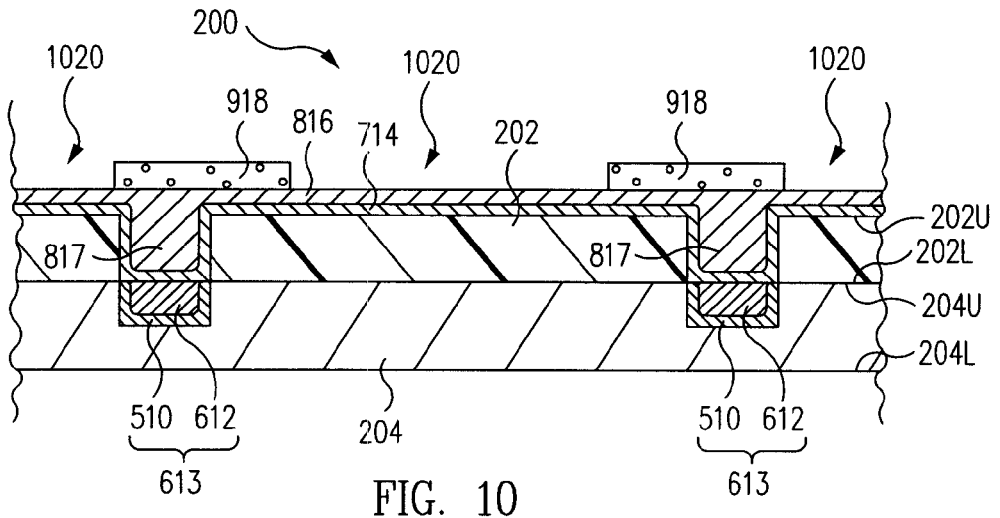

FIG. 10 is a cross-sectional view of protruding post substrate package 200 of FIG. 9 at a later stage during fabrication in accordance with one embodiment. Referring now to FIGS. 1 and 10 together, from apply resist operation 116, flow moves to a pattern resist operation 118. In pattern resist operation 118, resist 918 is patterned to form a positive image of the circuit pattern to be formed. More particularly, resist 918 is patterned to expose exposed portions 1020 of circuit pattern metal 816. Resist 918 is patterned using any one of a number of resist patterning techniques, and the particular technique used is not essential to this embodiment.

Figure 11:
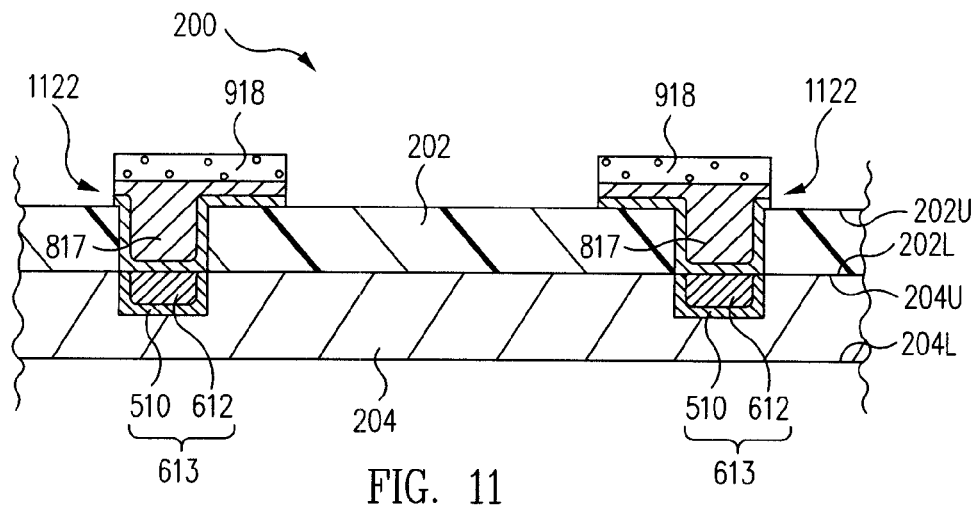

FIG. 11 is a cross-sectional view of protruding post substrate package 200 of FIG. 10 at a later stage during fabrication in accordance with one embodiment. Referring now to FIGS. 1, 10 and 11 together, from pattern resist operation 118, flow moves to an etch circuit pattern operation 120. In etch circuit pattern operation 120, circuit pattern metal 816 and seed layer 714 are etched using resist 918 as a mask to form a circuit pattern 1122. More particularly, exposed portions 1020 (FIG. 10) of circuit pattern metal 816 and the underlying portions of seed layer 714 are removed by etching using resist 918 as a mask to form circuit pattern 1122. Accordingly, circuit pattern 1122 is formed from the remaining portions of circuit pattern metal 816 and seed layer 714.

Illustratively, circuit pattern 1122 includes electrically conductive traces and lands, sometimes called pads. Circuit pattern 1122 is electrically connected to vias 817 and thus to protruding posts 613.

Figure 12:
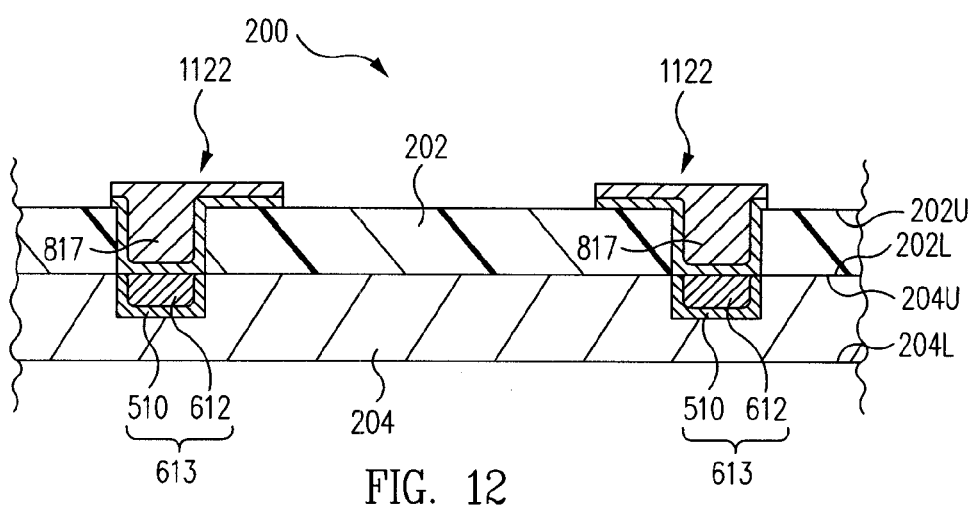

FIG. 12 is a cross-sectional view of protruding post substrate package 200 of FIG. 11 at a later stage during fabrication in accordance with one embodiment. Referring now to FIGS. 1, 11 and 12 together, from etch circuit pattern operation 120, flow moves to a remove resist operation 122. In remove resist operation 122, resist 918 is removed, sometimes called stripped, to expose circuit pattern 1122 as illustrated in FIG. 12.

Figure 13:
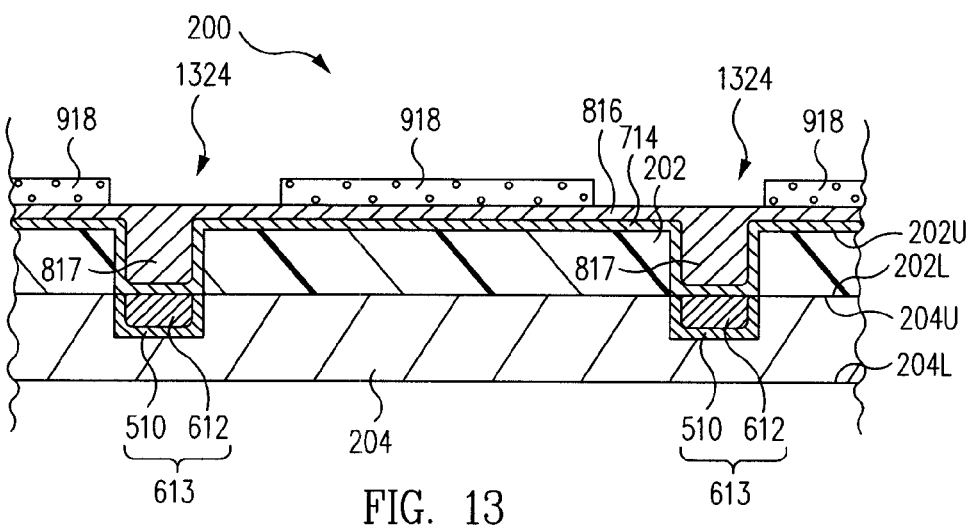
FIG. 13 is a cross-sectional view of the protruding post substrate package of FIG. 9 at a later stage during fabrication in accordance with another embodiment.

FIG. 13 is a cross-sectional view of protruding post substrate package 200 of FIG. 9 at a later stage during fabrication in accordance with another embodiment. Referring now to FIGS. 1 and 13 together, in pattern resist operation 118, resist 918 is patterned to form a negative image of the circuit pattern to be formed. More particularly, resist 918 is patterned to expose circuit pattern portions 1324 of circuit pattern metal 816. Resist 918 is patterned using any one of a number of resist patterning techniques, and the particular technique used is not essential to this embodiment.

Figure 14:
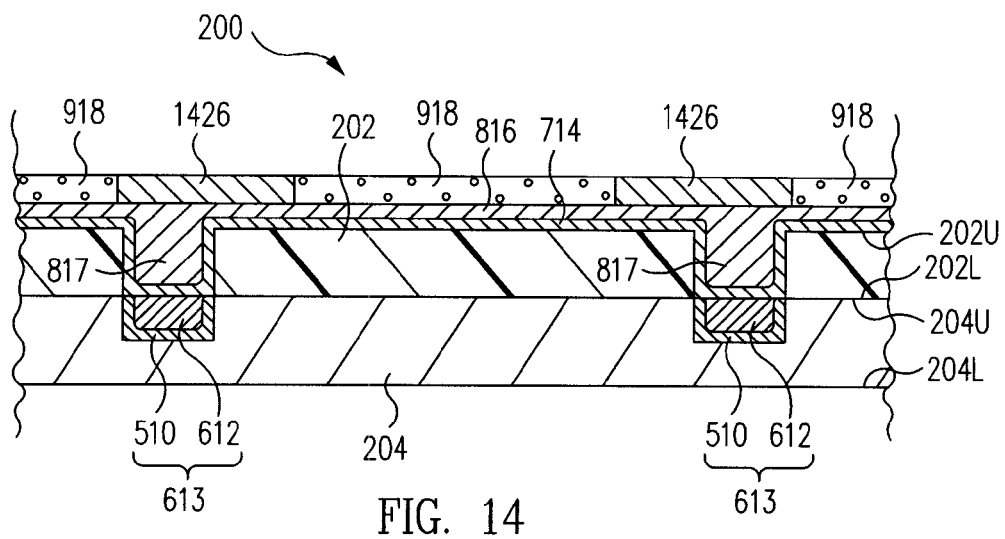
FIGS. 14, 15, 16, 17, 18, 19, 20, 21, 22 are cross-sectional views of the protruding post substrate package of FIG. 13 at later stages during fabrication in accordance with one embodiment.

FIG. 14 is a cross-sectional view of protruding post substrate package 200 of FIG. 13 at a later stage during fabrication in accordance with this alternative embodiment. Referring now to FIGS. 1, 13 and 14 together, from pattern resist operation 118, flow moves to a plate circuit pattern buildup layer operation 124. In plate circuit pattern buildup layer operation 124, a circuit pattern buildup layer 1426, e.g., copper, is plated on circuit pattern portions 1324 of circuit pattern metal 816. More particularly, circuit pattern buildup layer 1426 is plated on circuit pattern metal 816 using resist 918 as a mask.

Figure 15:
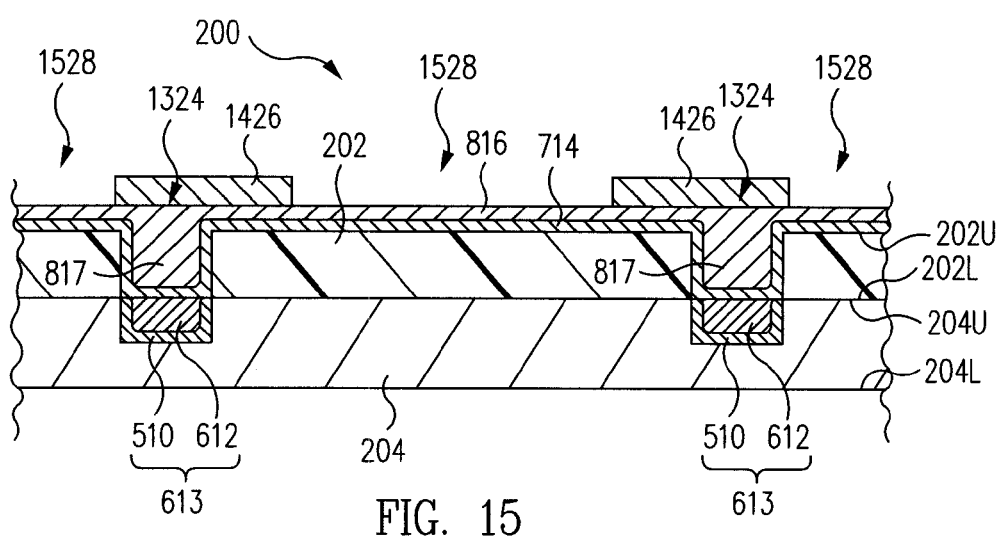

FIG. 15 is a cross-sectional view of protruding post substrate package 200 of FIG. 14 at a later stage during fabrication in accordance with one embodiment. Referring now to FIGS. 1, 14 and 15 together, from plate circuit pattern buildup layer operation 124, flow moves to remove resist operation 122. In remove resist operation 122, resist 918 is removed. Accordingly, circuit pattern buildup layer 1426 remains on and covers circuit pattern portions 1324 of circuit pattern metal 816. Further, circuit pattern buildup layer 1426 exposes exposed portions 1528 of circuit pattern metal 816.

Figure 16:
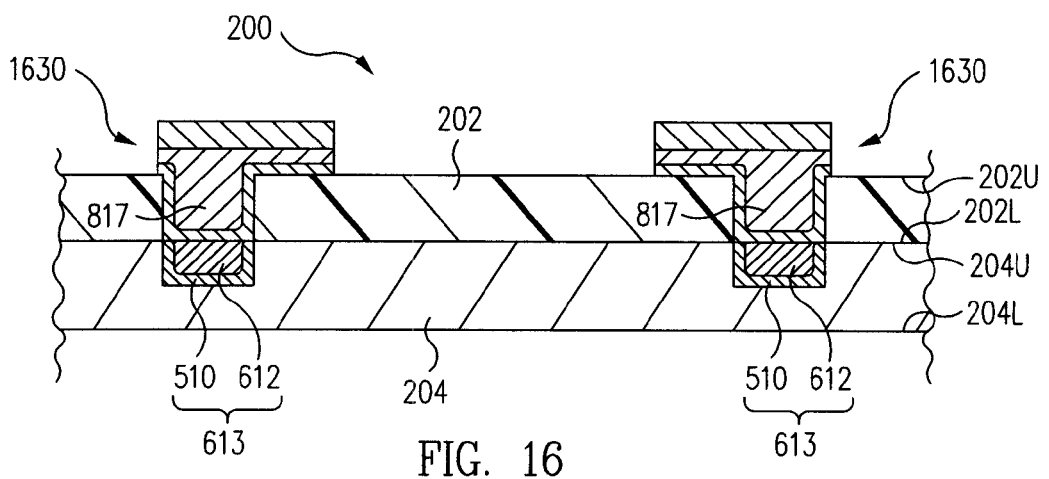

FIG. 16 is a cross-sectional view of protruding post substrate package 200 of FIG. 15 at a later stage during fabrication in accordance with one embodiment. Referring now to FIGS. 1, 15 and 16 together, from remove resist operation 122, flow moves to an etch circuit pattern operation 126. In etch circuit pattern operation 126, circuit pattern metal 816 and seed layer 714 are etched using circuit pattern buildup layer 1426 as a mask to form a circuit pattern 1630. More particularly, exposed portions 1528 (FIG. 15) of circuit pattern metal 816 and the underlying portions of seed layer 714 are removed by etching using circuit pattern buildup layer 1426 as a mask to form circuit pattern 1630. Accordingly, circuit pattern 1630 is formed from circuit pattern buildup layer 1426 and the remaining portions of circuit pattern metal 816 and seed layer 714.

Illustratively, circuit pattern 1630 includes electrically conductive traces and lands, sometimes called pads. Circuit pattern 1630 is electrically connected to vias 817 and thus to protruding posts 613.

In FIGS. 17-25 which follow, circuit pattern 1630 is illustrated and discussed below. However, in light of this disclosure, those of skill in the art will understand that circuit pattern 1122 of FIG. 12 can be substituted for circuit pattern 1630 in FIGS. 17-25 and the following discussion. Generally, operations 118, 120, 122 are performed to form circuit pattern 1122 and operations 118, 124, 122, and 126 are performed to form circuit pattern 1630 as discussed above.

Figure 17:
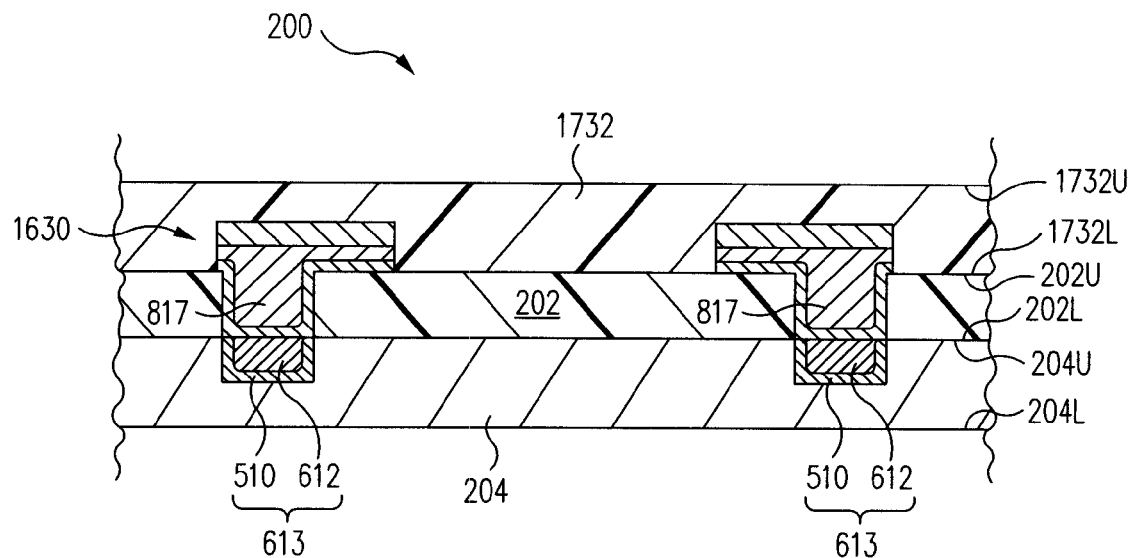

FIG. 17 is a cross-sectional view of protruding post substrate package 200 of FIG. 16 at a later stage during fabrication in accordance with one embodiment.

Referring now to FIGS. 1 and 17 together, from etch circuit pattern operation 126 (or from remove resist operation 122 in the event circuit pattern 1122 is formed), flow moves to an apply buildup dielectric layer operation 128. In apply buildup dielectric layer operation 128, a buildup dielectric layer 1732 is applied, e.g., by lamination, to second surface 202U of dielectric layer 202 and on circuit pattern 1630.

Buildup dielectric layer 1732 is a layer of dielectric, e.g., dielectric tape, dielectric film, adhesive, or other dielectric. A first surface 1732L of buildup dielectric layer 1732 is attached to second surface 202U of dielectric layer 202. Buildup dielectric layer 1732 further includes a second surface 1732U.

Figure 18:
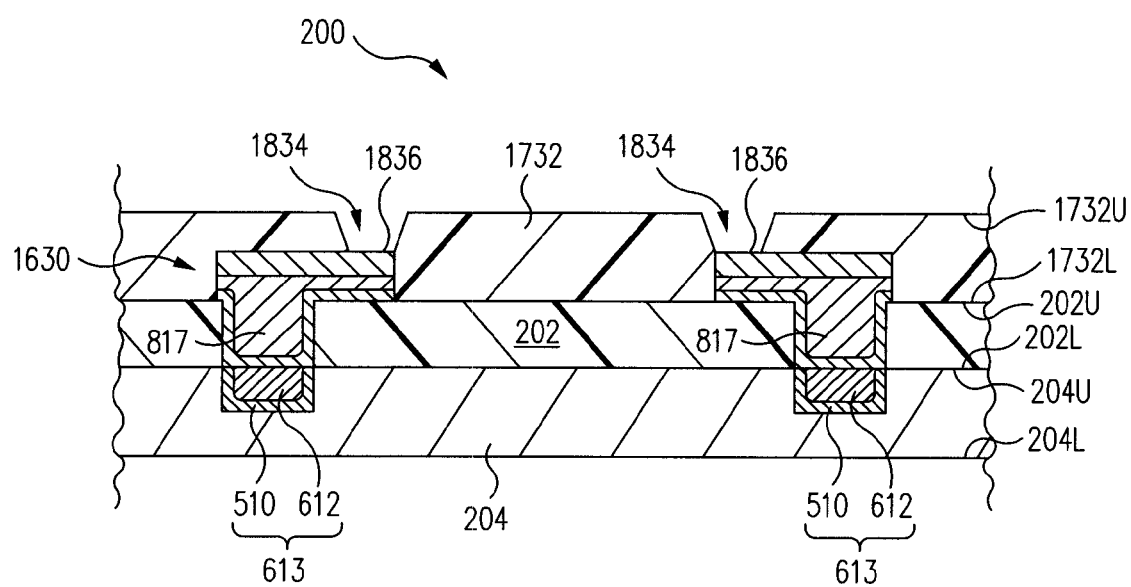

FIG. 18 is a cross-sectional view of protruding post substrate package 200 of FIG. 17 at a later stage during fabrication in accordance with one embodiment. Referring now to FIGS. 1 and 18 together, from apply buildup dielectric layer operation 128, flow moves to a form via apertures in buildup dielectric layer operation 130. In form via apertures in buildup dielectric layer operation 130, via apertures 1834 are formed, e.g., using laser-ablation, mechanical drilling, chemical etching, or other via aperture formation technique, in buildup dielectric layer 1732.

Via apertures 1834 extend entirely through buildup dielectric layer 1732 from second surface 1732U to first surface 1732L and to circuit pattern 1630. Accordingly, lands 1836 of circuit pattern 1630 are exposed through via apertures 1834.

Figure 19:
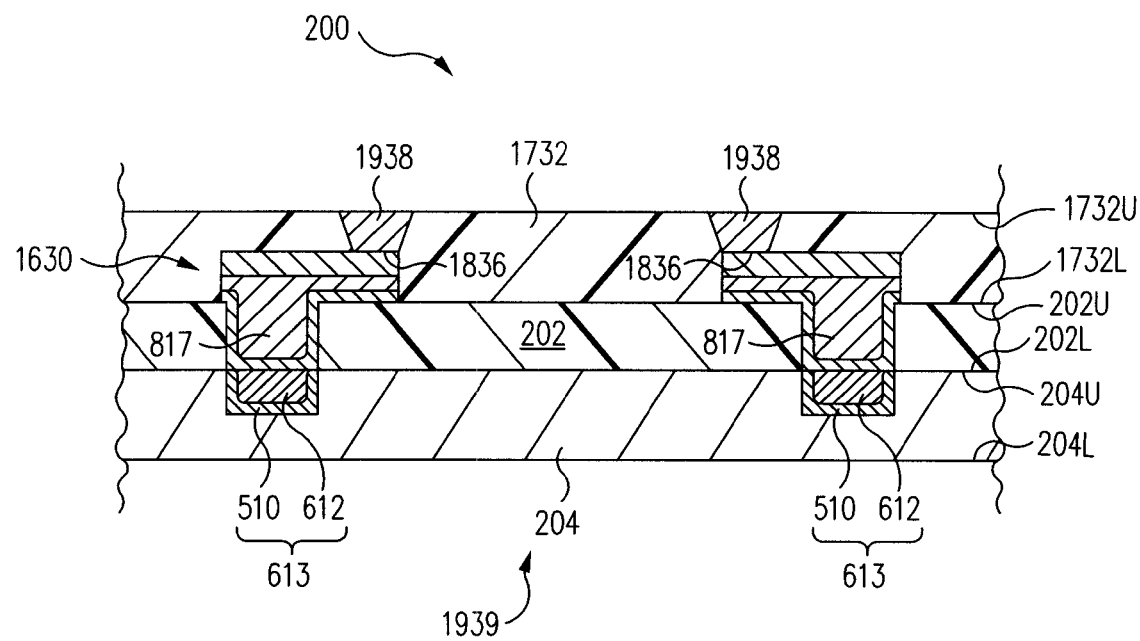

FIG. 19 is a cross-sectional view of protruding post substrate package 200 of FIG. 18 at a later stage during fabrication in accordance with one embodiment. Referring now to FIGS. 1, 18 and 19 together, from form via apertures in buildup dielectric layer operation 130, flow moves, optionally, to a fill via apertures to form vias operation 132. In fill via apertures to form vias operation 132, via apertures 1834 (FIG. 18) are filled, e.g., with plated copper, to form electrically conductive vias 1938 as illustrated FIG. 19. Vias 1938 can include a plating, e.g., a nickel-gold plate (finish) on the plated copper. In one embodiment, carrier 204 is used as a backside buss for the nickel-gold plate and copper plating.

Vias 1938 extend through buildup dielectric layer 1732. Vias 1938 are electrically connected to lands 1836 of circuit pattern 1630 at first surface 1732L of buildup dielectric layer 1732. Protruding post substrate package 200 at the stage of fabrication illustrated in FIG. 19 is sometimes called a protruding post substrate carrier structure 1939.

Fill via apertures to form vias operation 132 and thus formation of vias 1938 is optional, and in one embodiment, is not performed. In accordance with this embodiment, flip chip bumps, bond wires or interconnection balls are directly electrically and physically connected to lands 1836 of circuit pattern 1630 through via apertures 1834 as discussed further below.

Figure 20:
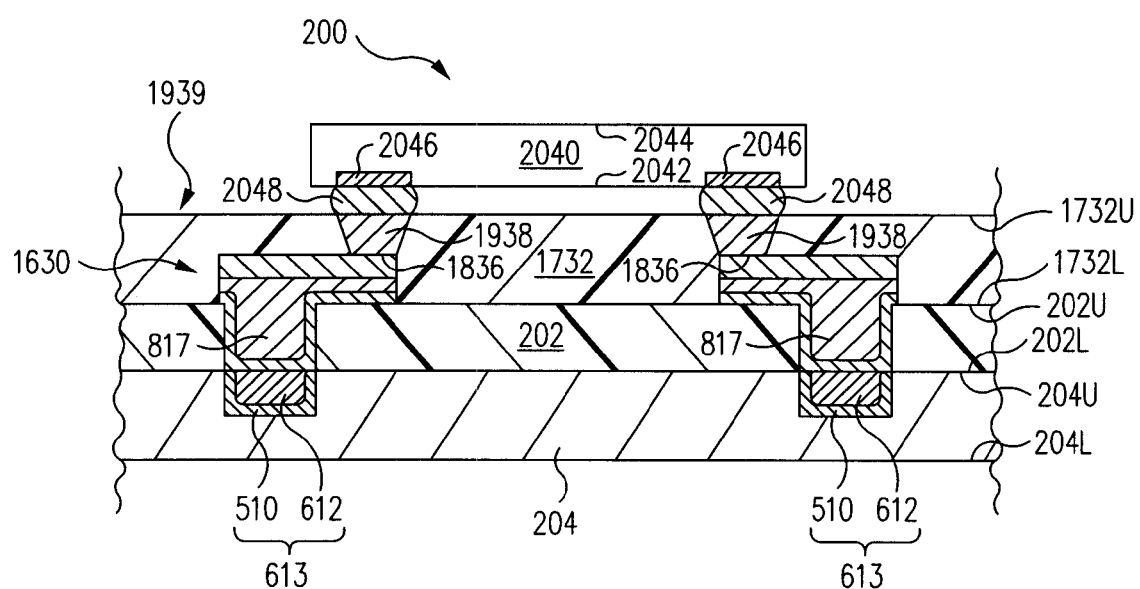

FIG. 20 is a cross-sectional view of protruding post substrate package 200 of FIG. 19 at a later stage during fabrication in accordance with one embodiment. Referring now to FIGS. 1 and 20 together, from fill via apertures to form vias operation 132 (or directly from form via apertures in buildup dielectric layer operation 130 in the event that fill via apertures to form vias operation 132 is not performed), flow moves to an attach electronic component operation 134.

In attach electronic component operation 134, an electronic component 2040 is attached to protruding post substrate carrier structure 1939. More particularly, electronic component 2040 is mounted to vias 1938 in a flip chip configuration.

Electronic component 2040 is a semiconductor die, sometimes called an integrated circuit chip or an active component. However, in other embodiments, electronic component 2040 is another type of electronic component such as a passive component, e.g., a resistor, capacitor or inductor.

In accordance with this embodiment, electronic component 2040 includes an active, e.g., first, surface 2042 and an opposite inactive surface 2044. Bond pads 2046 are formed on active surface 2042.

Bond pads 2046 are physically and electrically connected to vias 1938 by flip chip bumps 2048, e.g., solder bumps, copper posts with solder, or Solder on Pads (SOP). In one embodiment, an underfill is applied between active surface 2042 of electronic component 2040 and second surface 1732U of buildup dielectric layer 1732 and around flip chip bumps 2048.

As set forth above, fill via apertures to form vias operation 132 and thus formation of vias 1938 is optional, and in one embodiment, is not performed. In accordance with this embodiment, flip chip bumps 2048 are directly electrically and physically connected to lands 1836 of circuit pattern 1630 through via apertures 1834 (via apertures 1834 are illustrated in FIG. 18).

FIG. 21 is a cross-sectional view of protruding post substrate package 200 of FIG. 20 at a later stage during fabrication in accordance with one embodiment. Referring now to FIGS. 1 and 21 together, from attach electronic component operation 134, flow moves to an encapsulate operation 136. In encapsulate operation 136, electronic component 2040 is encapsulated, sometimes called enclosed or encased, in an encapsulant 2150.

Encapsulant 2150 is a dielectric material such as molding compound, a cured liquid encapsulant, or other dielectric material.

Encapsulant 2150 encapsulates second surface 1732U of buildup dielectric layer 1732 and electronic component 2040. In accordance with this embodiment, encapsulant 2150 fills the space between active surface 2042 of electronic component 2040 and second surface 1732U of buildup dielectric layer 1732.

Carrier 204 is formed of a relative rigid material. Accordingly, carrier 204 provides rigidity and strength thus ensuring that protruding post substrate package 200 remains flat, i.e., has an absence of warpage or bending, during the fabrication operations as described above. Once encapsulant 2150 is formed, encapsulant 2150 provides the rigidity and strength for protruding post substrate package 200 thus allowing carrier 204 to be removed while at the same time preventing warpage or bending of protruding post substrate package 200.

FIG. 22 is a cross-sectional view of protruding post substrate package 200 of FIG. 21 at a later stage during fabrication in accordance with one embodiment. Referring now to FIGS. 1, 21 and 22 together, from encapsulate operation 136, flow moves to a remove carrier operation 138. In remove carrier operation 138, carrier 204 is removed.

As discussed above, in one embodiment, first metal 510 is formed of an etch stop metal, e.g., nickel, tin, gold, or palladium that is selectively etchable compared to carrier 204, e.g., copper. This facilitates etch removal of carrier 204 in remove carrier operation 138 without etching (removal) of protruding posts 613. In one embodiment, carrier 204 is copper and is removed using a copper etch process as the carrier etch process. During this copper etch process, first metal 510 provide an etch stop for the copper etch process.

After removal of carrier 204, paying particular attention now to FIG. 22, protruding posts 613, sometimes called copper pillars or copper posts, protrude outward from first surface 202L of dielectric layer 202. Protruding posts 613 thus provide the interconnection structure for electrical and physical mounting of protruding post substrate package 200 to a larger substrate such as a printed circuit motherboard. Protruding posts 613 can be reliably formed with an extremely fine pitch. Further, protruding posts are bonded to vias 817 thus minimizing the possibility of separation of protruding posts 613 from protruding post substrate package 200.

Figure 22A:
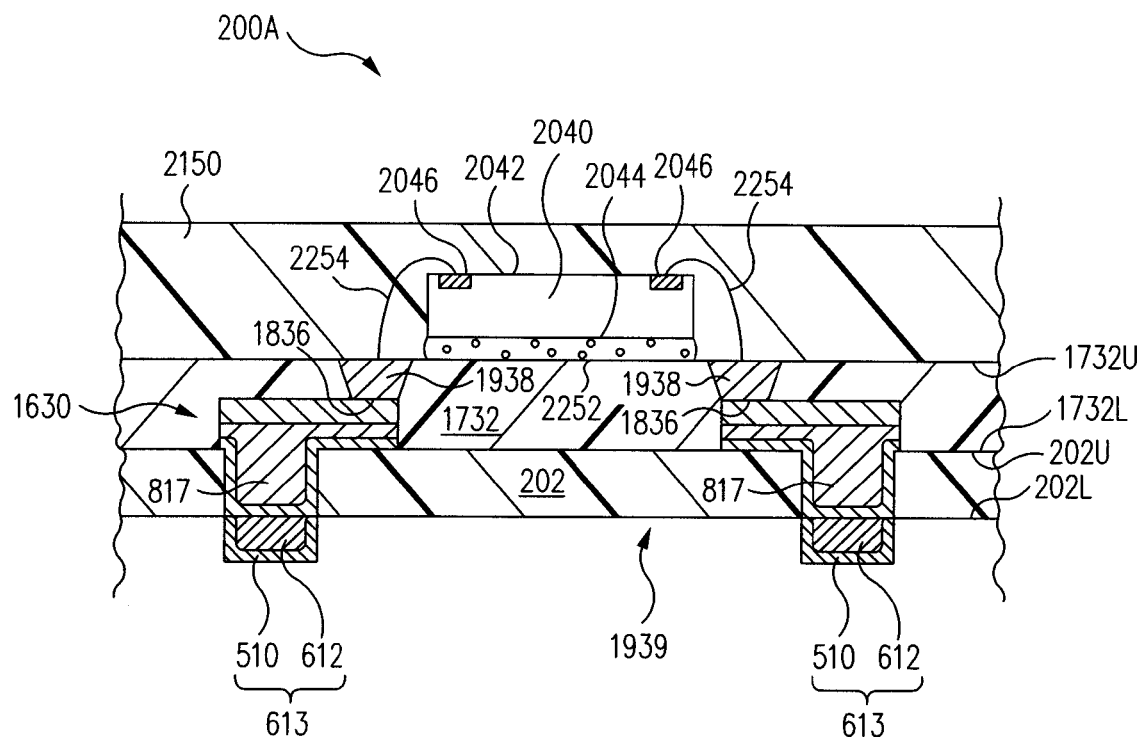
FIG. 22A is a cross-sectional view of a protruding post substrate package in accordance with another embodiment.

FIG. 22A is a cross-sectional view of a protruding post substrate package 200A in accordance with another embodiment. Protruding post substrate package 200A of FIG. 22A is substantially similar to protruding post substrate package 200 of FIG. 22 and only the significant differences between protruding post substrate packages 200A, 200 are discussed below.

Referring now to FIGS. 1 and 22A together, in attach electronic component operation 134, electronic component 2040 is attached to protruding post substrate carrier structure 1939 in a wirebond configuration. More particularly, inactive surface 2044 of electronic component 2040 is attached to second surface 1732U of buildup dielectric layer 1732 with an adhesive 2252, sometimes called a die attach adhesive. Further, bond pads 2046 on active surface 2042 of electronic component 2040 are electrically connected to vias 1938 by bond wires 2254.

As set forth above, fill via apertures to form vias operation 132 and thus formation of vias 1938 is optional, and in one embodiment, is not performed. In accordance with this embodiment, bond wires 2254 are directly electrically and physically connected to lands 1836 of circuit pattern 1630 through via apertures 1834 (via apertures 1834 are illustrated in FIG. 18).

In encapsulate operation 136, electronic component 2040 including bond wires 2254 and second surface 1732U of buildup dielectric layer 1732 are encapsulated in encapsulant 2150.

In remove carrier operation 138, carrier 204 is removed (carrier 204 is not illustrated in FIG. 22A, see carrier 204 of FIG. 19 for example) resulting in protruding post substrate package 200A as illustrated in FIG. 22A.

Figure 23:
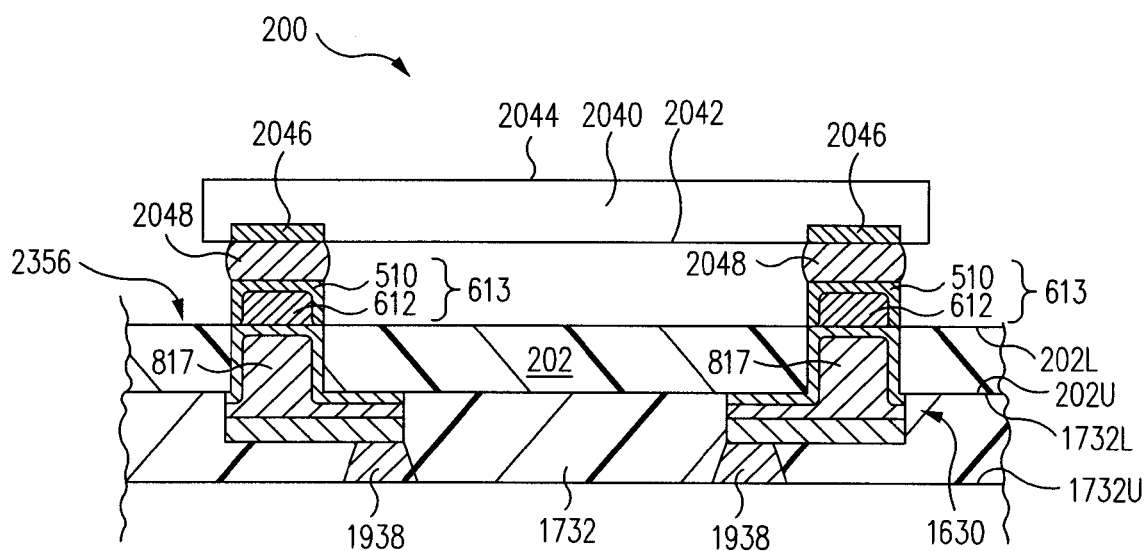
FIG. 23 is a cross-sectional view of the protruding post substrate package of FIG. 19 at a later stage during fabrication in accordance with another embodiment.

FIG. 23 is a cross-sectional view of protruding post substrate package 200 of FIG. 19 at a later stage during fabrication in accordance with another embodiment. Referring now to FIGS. 1, 19 and 23 together, from fill via apertures to form vias operation 132 (or directly from form via apertures in buildup dielectric layer operation 130 in the event that fill via apertures to form vias operation 132 is not performed), flow moves to remove carrier operation 138 as indicated by the dashed arrow. In remove carrier operation 138, carrier 204 is removed resulting in a protruding post substrate 2356. After removal of carrier 204, protruding post substrate 2356 is inverted from the view of FIG. 19 resulting in the view of FIG. 23.

Referring now to FIGS. 1 and 23 together, from remove carrier operation 138, flow moves to attach electronic component operation 134 as indicated by the dashed arrow. In attach electronic component operation 134, electronic component 2040 is attached to protruding post substrate 2356 in a flip chip configuration. More particularly, bond pads 2046 are physically and electrically connected to protruding posts 613 by flip chip bumps 2048. In one embodiment, an underfill is applied between active surface 2042 of electronic component 2040 and first surface 202L (which is facing upwards in this embodiment) of dielectric layer 202 and around flip chip bumps 2048 and protruding posts 613.

Figure 24:
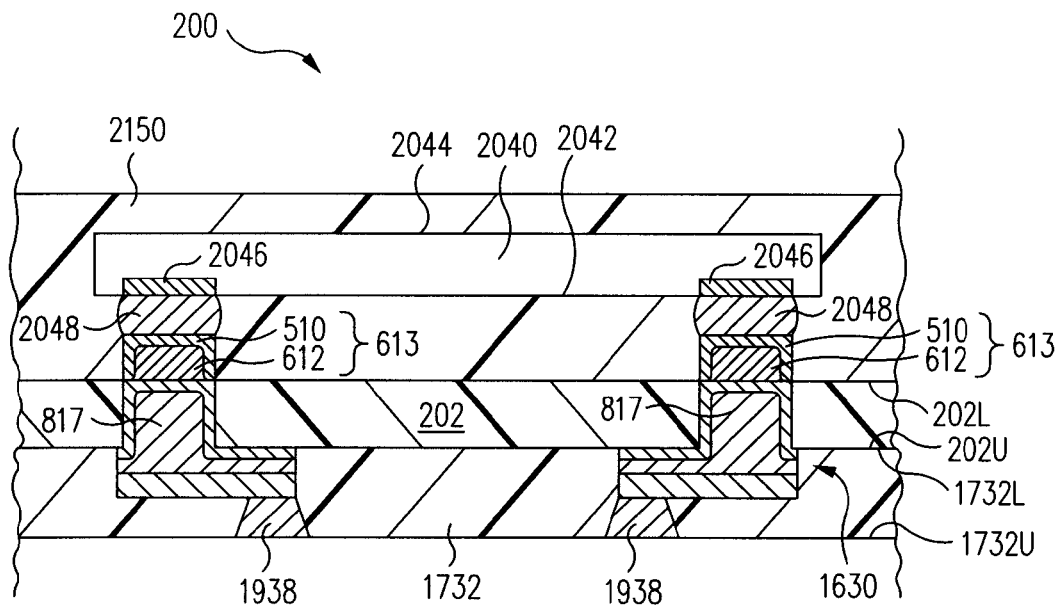
FIGS. 24, 25 are cross-sectional views of the protruding post substrate package of FIG. 23 at later stages during fabrication in accordance with one embodiment.

FIG. 24 is a cross-sectional view of protruding post substrate package 200 of FIG. 23 at a later stage during fabrication in accordance with one embodiment. Referring now to FIGS. 1 and 24 together, from attach electronic component operation 134, flow moves to encapsulate operation 136. In encapsulate operation 136, electronic component 2040 is encapsulated in encapsulant 2150.

Encapsulant 2150 encapsulates first surface 202L of dielectric layer 202 and electronic component 2040. In accordance with this embodiment, encapsulant 2150 fills the space between active surface 2042 of electronic component 2040 and first surface 202L of dielectric layer 202.

Figure 25:
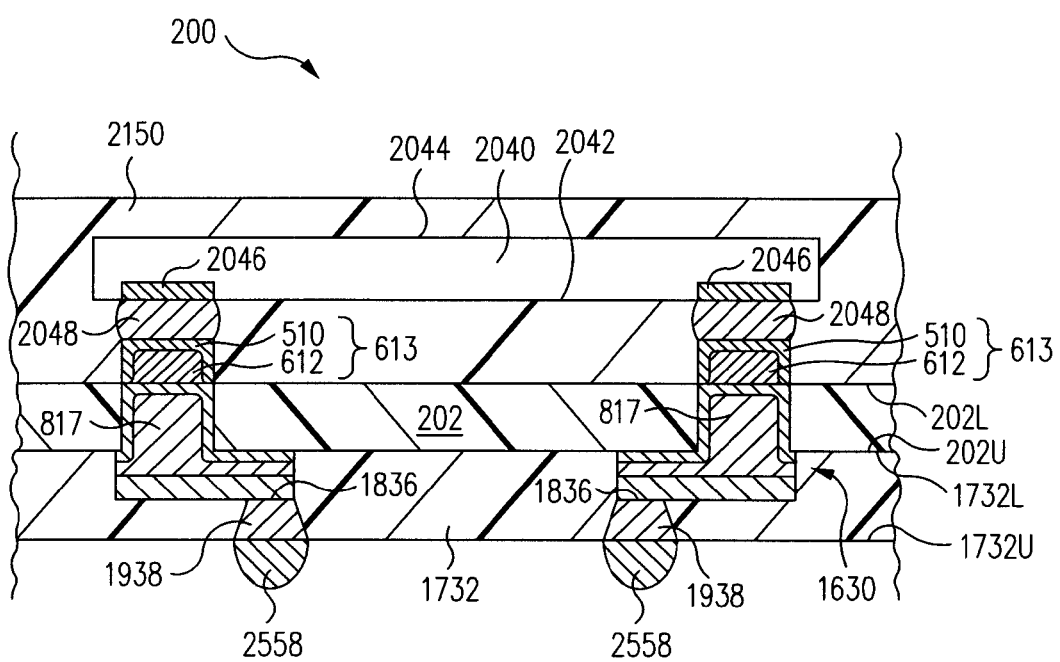

FIG. 25 is a cross-sectional view of protruding post substrate package 200 of FIG. 24 at a later stage during fabrication in accordance with one embodiment. Referring now to FIGS. 1 and 25 together, from encapsulate operation 136, flow moves to a form interconnection balls operation 140 as indicated by the dashed arrow. In form interconnection balls operation 140, interconnection balls 2558 are formed on vias 1938. Interconnection balls 2558 protrude outward from second surface 1732U (which is facing downwards in this embodiment) of buildup dielectric layer 1732. Interconnection balls 2558, e.g., a ball grid array (BGA), thus provide the interconnection structure for electrical and physical mounting of protruding post substrate package 200 to a larger substrate such as a printed circuit motherboard.

As set forth above, fill via apertures to form vias operation 132 and thus formation of vias 1938 is optional, and in one embodiment, is not performed. In accordance with this embodiment, interconnection balls 2558 are directly electrically and physically connected to lands 1836 of circuit pattern 1630 through via apertures 1834 (via apertures 1834 are illustrated in FIG. 18).

Figure 25A:
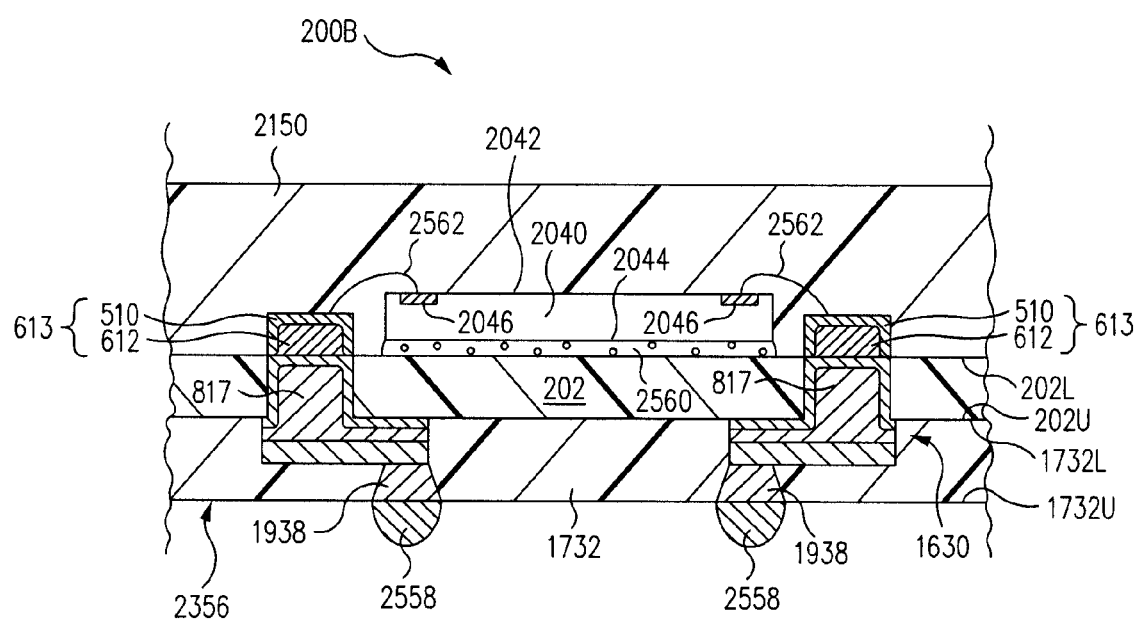
FIG. 25A is a cross-sectional view of a protruding post substrate package in accordance with another embodiment.

FIG. 25A is a cross-sectional view of a protruding post substrate package 200B in accordance with another embodiment. Protruding post substrate package 200B of FIG. 25A is substantially similar to protruding post substrate package 200 of FIG. 25 and only the significant differences between protruding post substrate packages 200B, 200 are discussed below.

Referring now to FIGS. 1 and 25A together, in attach electronic component operation 134, electronic component 2040 is attached to protruding post substrate 2356 in a wire-bond configuration. More particularly, inactive surface 2044 of electronic component 2040 is attached to first surface 202L (which is facing upwards in this embodiment) of dielectric layer 202 with an adhesive 2560, sometimes called a die attach adhesive. Further, bond pads 2046 on active surface 2042 of electronic component 2040 are electrically connected to protruding posts 613 by bond wires 2562.

In encapsulate operation 136, electronic component 2040 including bond wires 2562 and first surface 202L of dielectric layer 202 are encapsulated in encapsulant 2150. In form interconnection balls operation 140, interconnection balls 2558 are formed on vias 1938 resulting in protruding post substrate package 200B as illustrated in FIG. 25A.

Figure 26:
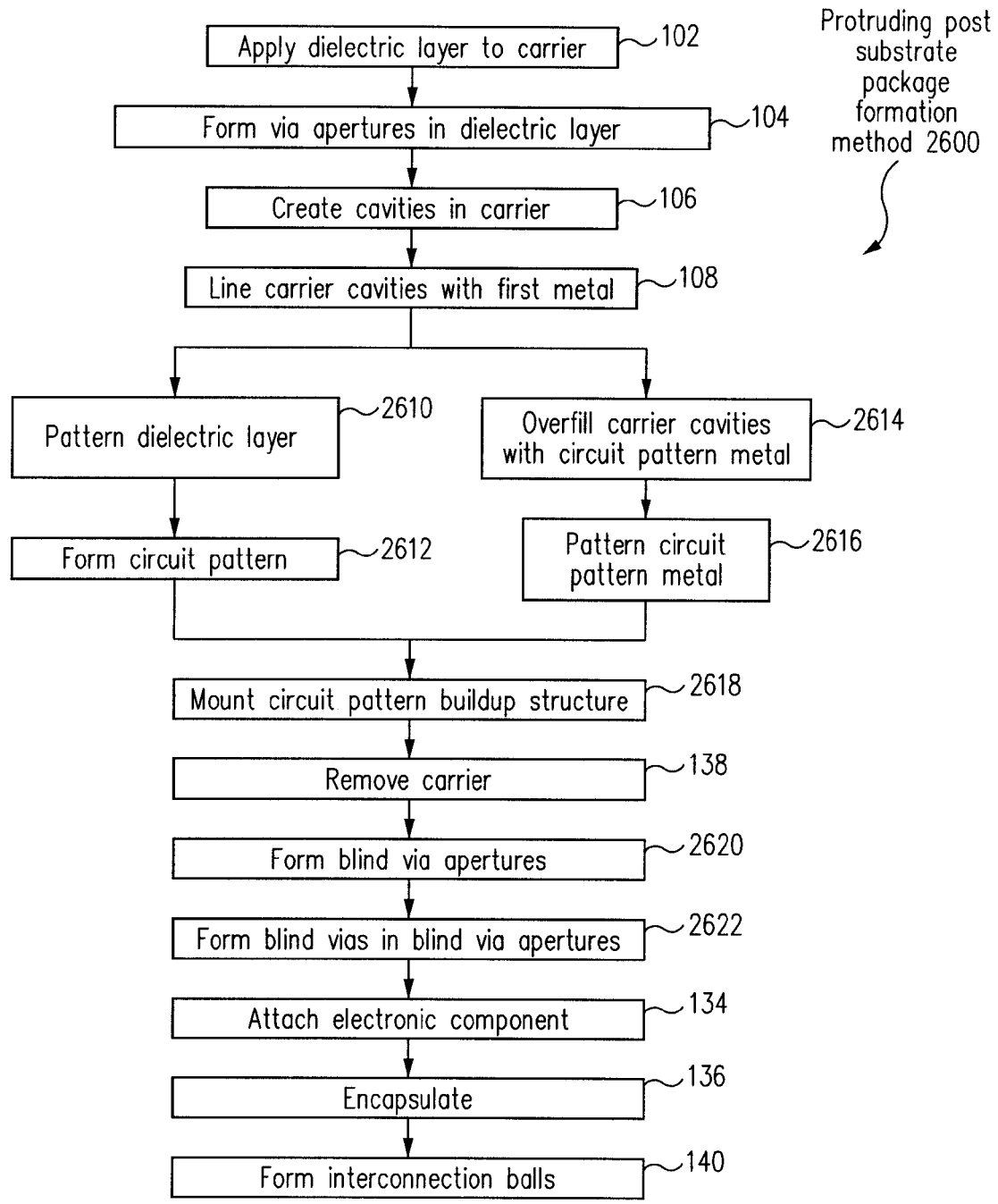
FIG. 26 is a protruding post substrate package formation method in accordance with another embodiment.
Figure 27:
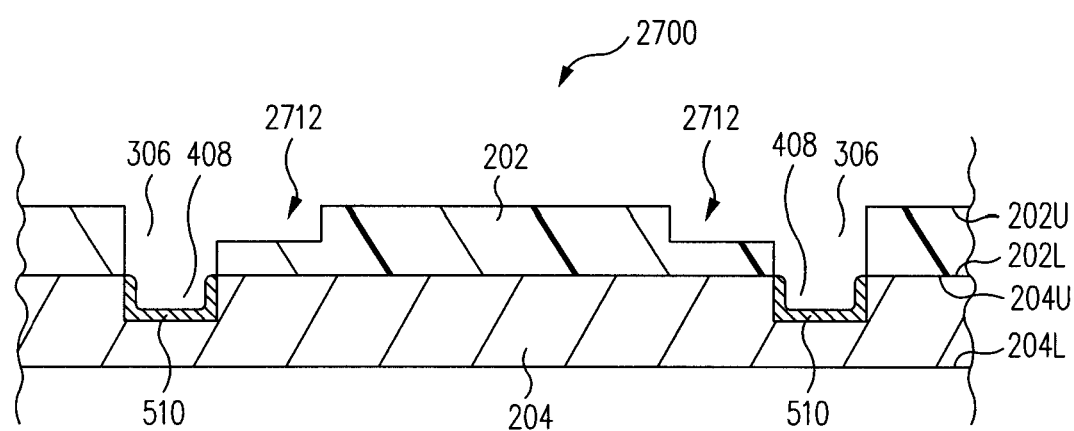
FIG. 27 is a cross-sectional view of a protruding post substrate package during fabrication in accordance with one embodiment.

FIG. 26 is a protruding post substrate package formation method 2600 in accordance with another embodiment. FIG. 27 is a cross-sectional view of a protruding post substrate package 2700 during fabrication in accordance with one embodiment. Referring now to FIGS. 26 and 27 together, apply dielectric layer to carrier operation 102, form via apertures in dielectric layer operation 104, create cavities in carrier operation 106, line carrier cavities with first metal operation 108 are performed as discussed above with reference to protruding post substrate package formation method 100 of FIG. 1 and so are not repeated here.

From line carrier cavities with first metal operation 108 (and the structure illustrated in FIG. 5), flow moves to a pattern dielectric layer operation 2610. In pattern dielectric layer operation 2610, dielectric layer 202 is patterned, e.g., using laser ablation or other patterning technique, to form a circuit pattern feature 2712 in dielectric layer 202. More particularly, circuit pattern feature 2712 is a patterned opening formed in second surface 202U of dielectric layer 202. Circuit pattern feature 2712 extends partially into dielectric layer 202 such that dielectric layer 202 remains between circuit pattern feature 2712 and first surface 202L of dielectric layer 202. In one embodiment, circuit pattern feature 2712 includes traces channels and lands apertures.

Figure 28:
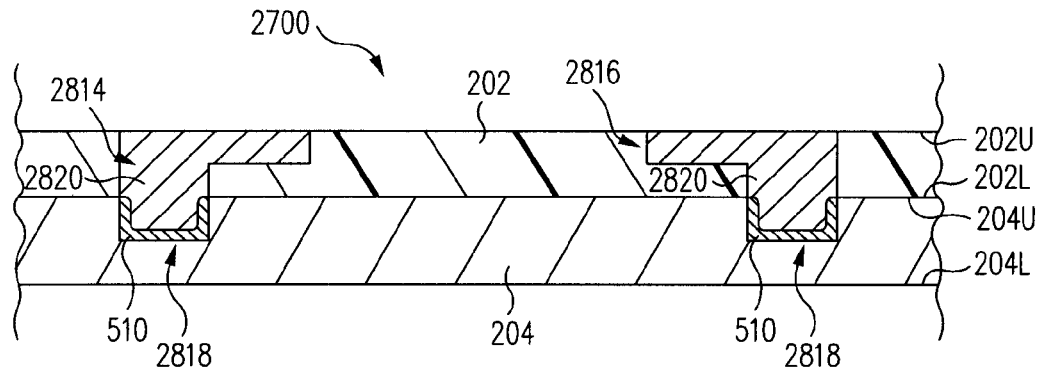
FIG. 28 is a cross-sectional view of the protruding post substrate package of FIG. 27 at a later stage during fabrication in accordance with one embodiment.

FIG. 28 is a cross-sectional view of protruding post substrate package 2700 of FIG. 27 at a later stage during fabrication in accordance with one embodiment. Referring now to FIGS. 26, 27 and 28 together, from pattern dielectric layer operation 2610, flow moves to a form circuit pattern operation 2612. In form circuit pattern operation 2612, carrier cavities 408 in carrier 204, via apertures 306 in dielectric layer 202, and circuit pattern feature 2712 are filled with a circuit pattern metal 2814, e.g., copper, to form a circuit pattern 2816.

More particularly, circuit pattern metal 2814 within carrier cavities 408 and first metal 510 form protruding posts 2818. Circuit pattern metal 2814 within via apertures 306 forms electrically conductive vias 2820 extending through dielectric layer 202. Vias 2820 are electrically connected to protruding posts 2818 at first surface 202L of dielectric layer 202.

Further, circuit pattern metal 2814 fills circuit pattern feature 2712 to form circuit pattern 2816. As illustrated in FIG. 28, circuit pattern 2816 is embedded within dielectric layer 202. Illustratively, circuit pattern 2816 includes electrically conductive traces and lands, sometimes called pads. Circuit pattern 2816 is electrically connected to vias 2820 and thus to protruding posts 2818.

Figure 29:
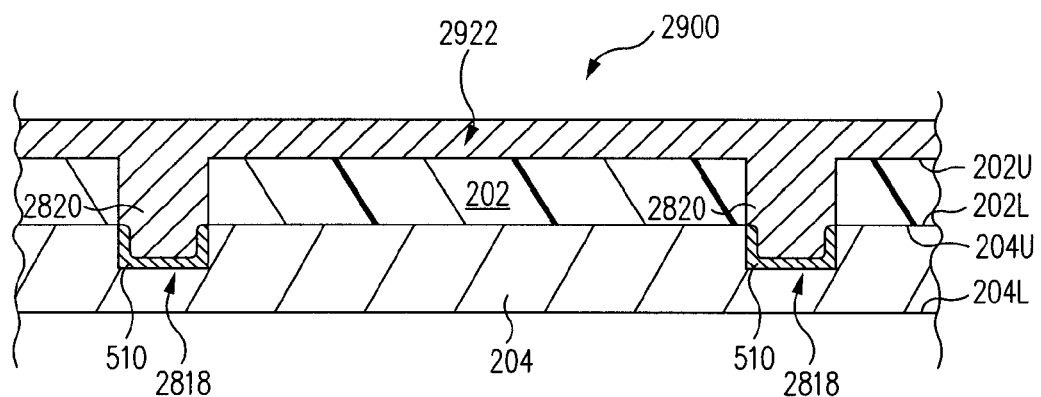
FIG. 29 is a cross-sectional view of a protruding post substrate package during fabrication in accordance with another embodiment.

FIG. 29 is a cross-sectional view of a protruding post substrate package 2900 during fabrication in accordance with another embodiment. Referring now to FIGS. 5, 26 and 29 together, apply dielectric layer to carrier operation 102, form via apertures in dielectric layer operation 104, create cavities in carrier operation 106, line carrier cavities with first metal operation 108 are performed as discussed above with reference to protruding post substrate package formation method 100 of FIG. 1 and so are not repeated here.

From line carrier cavities with first metal operation 108 (and the structure illustrated in FIG. 5), flow moves to an overfill carrier cavities with circuit pattern metal operation 2614. In overfill carrier cavities with circuit pattern metal operation 2614, carrier cavities 408 (see FIG. 5) in carrier 204 are over filled with a circuit pattern metal 2922. More particularly, circuit pattern metal 2922 fills carrier cavities 408 in carrier 204, via apertures 306 (see FIG. 5) in dielectric layer 202, and covers second surface 202U of dielectric layer 202.

Circuit pattern metal 2922 within carrier cavities 408 and first metal 510 form protruding posts 2818.

Circuit pattern metal 2922 within via apertures 306 forms electrically conductive vias 2820 extending through dielectric layer 202. Vias 2820 are electrically connected to protruding posts 2818 at first surface 202L of dielectric layer 202.

Further, circuit pattern metal 2922 entirely covers second surface 202U of dielectric layer 202.

Figure 30:
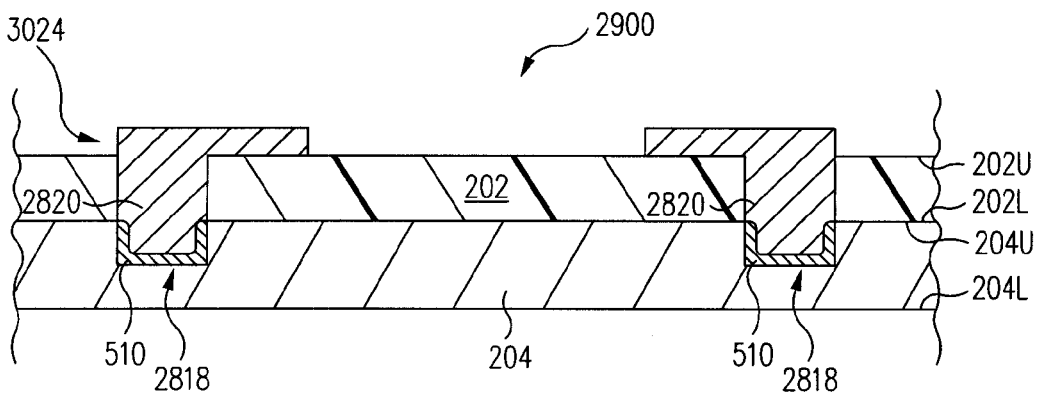
FIGS. 30, 31, 32, 33, 34, 35 are cross-sectional views of the protruding post substrate package of FIG. 29 at later stages during fabrication in accordance with one embodiment.

FIG. 30 is a cross-sectional view of protruding post substrate package 2900 of FIG. 29 at a later stage during fabrication in accordance with one embodiment. Referring now to FIGS. 26, 29 and 30 together, from overfill carrier cavities with circuit pattern metal operation 2614, flow moves to a pattern circuit pattern metal operation 2616. In pattern circuit pattern metal operation 2616, circuit pattern metal 2922 is patterned to form a circuit pattern 3024. Circuit pattern metal 2922 is patterned using any one of a number of techniques, e.g., for example, using a resist similar to resist 918 as discussed above, using laser ablation, or other circuit pattern metal patterning technique.

Illustratively, circuit pattern 3024 includes electrically conductive traces and lands, sometimes called pads. Circuit pattern 3024 is electrically connected to vias 2820 and thus to protruding posts 2818.

Referring now to FIGS. 26, 28 and 30 together, circuit pattern 3024 of FIG. 30 is formed on second surface 202U of dielectric layer 202 in contrast to circuit pattern 2816 of FIG. 28, which is embedded in second surface 202U of dielectric layer 202. In FIGS. 31-36 which follow, circuit pattern 3024 is illustrated and discussed below. However, in light of this disclosure, those of skill in the art will understand that circuit pattern 2816 of FIG. 28 can be substituted for circuit pattern 3024 in FIGS. 31-36.

Figure 31:
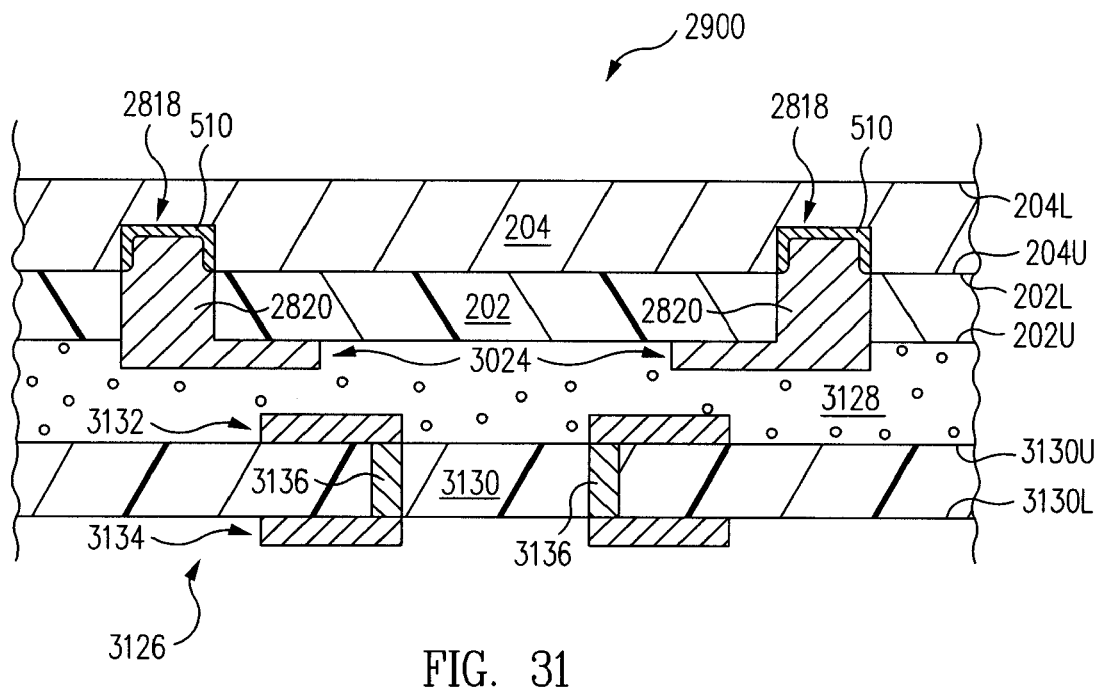

FIG. 31 is a cross-sectional view of protruding post substrate package 2900 of FIG. 30 at a later stage during fabrication in accordance with one embodiment. Referring now to FIGS. 26 and 31 together, from pattern circuit pattern metal operation 2616 (or from form circuit pattern operation 2612 in the event circuit pattern 2816 is formed), flow moves to a mount circuit pattern buildup structure operation 2618.

In mount circuit pattern buildup structure operation 2618, the assembly as illustrated in FIG. 30 is inverted and a circuit pattern buildup structure 3126 is mounted with an adhesive 3128. Circuit pattern buildup structure 3126 includes a dielectric core 3130 having first surface 3130U and an opposite second surface 3130L.

Circuit pattern buildup structure 3126 further includes a first circuit pattern 3132 on first surface 3130U and a second circuit pattern 3134 on second surface 3130L. First circuit pattern 3132 is electrically connected to second circuit pattern 3134 by electrically conductive vias 3136 extending through dielectric core 3130. Although circuit patterns 3132, 3134 are illustrated and discussed as being on surfaces 3130U, 3130L, in another embodiment, circuit patterns 3132, 3134 are embedded within surfaces 3130U, 3130L, respectively.

First surface 3130U and first circuit pattern 3132 are mounted to second surface 202U (which is facing downward in this embodiment) of dielectric layer 202 and circuit pattern 3024 by adhesive 3128, which is a dielectric.

Figure 32:
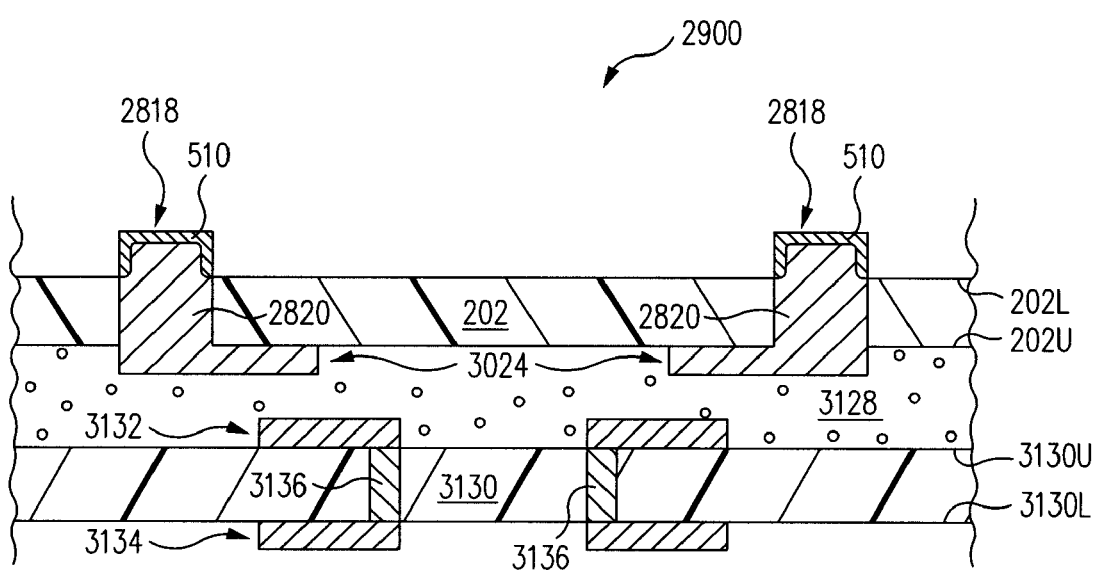

FIG. 32 is a cross-sectional view of protruding post substrate package 2900 of FIG. 31 at a later stage during fabrication in accordance with one embodiment. Referring now to FIGS. 26, 31 and 32 together, from mount circuit pattern buildup structure operation 2618, flow moves to remove carrier operation 138. In remove carrier operation 138, carrier 204 is removed as discussed above. Upon removal of carrier 204, protruding posts 2818 protrude outward from first surface 202L of dielectric layer 202.

Carrier 204 is formed of a relative rigid material. Accordingly, carrier 204 provides rigidity and strength thus ensuring that protruding post substrate package 2900 remains flat, i.e., has an absence of warpage or bending, during the fabrication operations as described above. Once circuit pattern buildup structure 3126 is mounted, circuit pattern buildup structure 3126 provides the rigidity and strength for protruding post substrate package 2900 thus allowing carrier 204 to be removed while at the same time preventing warpage or bending of protruding post substrate package 2900.

Figure 33:
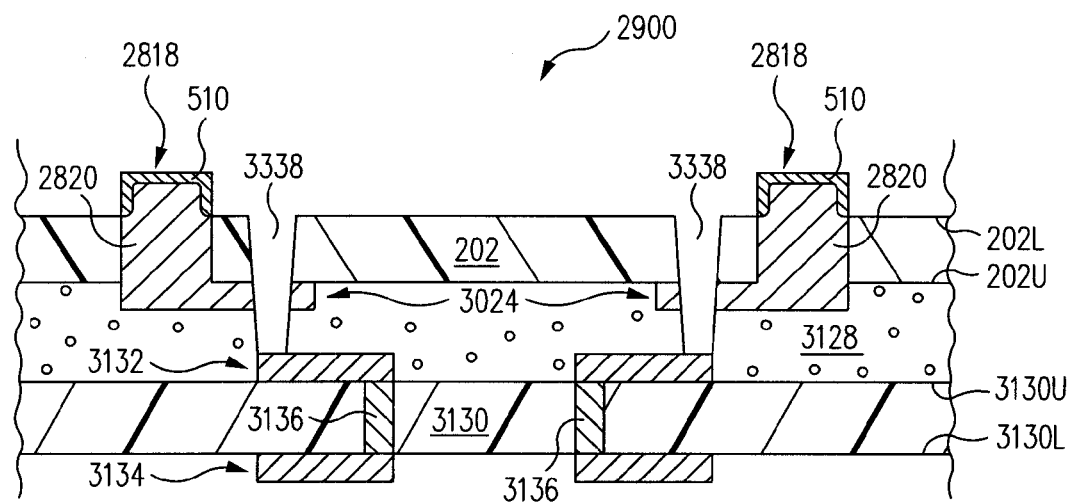

FIG. 33 is a cross-sectional view of protruding post substrate package 2900 of FIG. 32 at a later stage during fabrication in accordance with one embodiment. Referring now to FIGS. 26 and 33 together, from remove carrier operation 138, flow moves to a form blind via apertures operation 2620. In form blind via apertures operation 2620, blind via apertures 3338 are formed, e.g., using laser-ablation, mechanical drilling, chemical etching, or other blind via aperture formation technique. Blind via apertures 3338 extend through dielectric layer 202, through circuit pattern 3024, through adhesive 3128, to expose first circuit pattern 3132.

Figure 34:
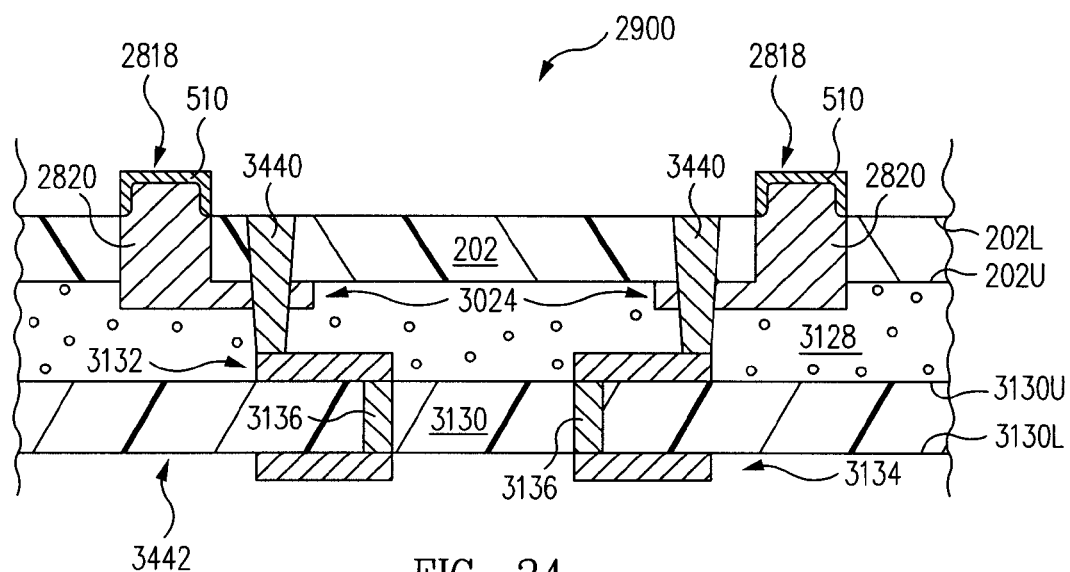

FIG. 34 is a cross-sectional view of protruding post substrate package 2900 of FIG. 33 at a later stage during fabrication in accordance with one embodiment. Referring now to FIGS. 26, 33 and 34 together, from form blind via apertures operation 2620, flow moves to a form blind vias in blind via apertures operation 2622. In form blind vias in blind via apertures operation 2622, electrically conductive blind vias 3440 are formed in blind via apertures 3338. In one embodiment, blind via apertures 3338 are filled with electrically conductive material, e.g., by plating or applying electrically conductive paste, to form blind vias 3440.

Blind vias 3440 extend through dielectric layer 202, through circuit pattern 3024, through adhesive 3128, to first circuit pattern 3132. Blind vias 3440 electrically connect circuit pattern 3024 with first circuit pattern 3132 and through adhesive 3128. Formation of blind vias 3440 results in a protruding post substrate 3442 as illustrated in FIG. 34.

Figure 35:
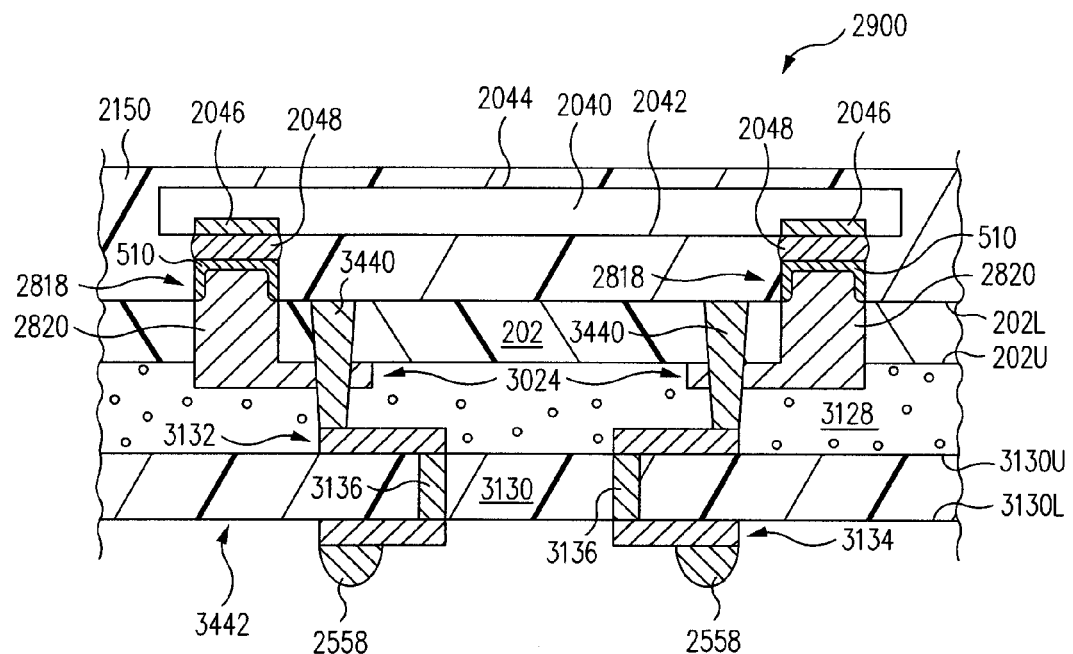

FIG. 35 is a cross-sectional view of protruding post substrate package 2900 of FIG. 34 at a later stage during fabrication in accordance with another embodiment. Referring now to FIGS. 26 and 35 together, from form blind vias in blind via apertures operation 2622, flow moves to attach electronic component operation 134.

In attach electronic component operation 134, electronic component 2040 is attached to protruding post substrate 3442 in a flip chip configuration. More particularly, bond pads 2046 are physically and electrically connected to protruding posts 2818 by flip chip bumps 2048. In one embodiment, an underfill is applied between active surface 2042 of electronic component 2040 and first surface 202L of dielectric layer 202 and around flip chip bumps 2048 and protruding posts 2818.

From attach electronic component operation 134, flow moves to encapsulate operation 136. In encapsulate operation 136, electronic component 2040 is encapsulated in encapsulant 2150.

Encapsulant 2150 encapsulates first surface 202L of dielectric layer 202 and electronic component 2040. In accordance with this embodiment, encapsulant 2150 fills the space between active surface 2042 of electronic component 2040 and first surface 202L of dielectric layer 202.

From encapsulate operation 136, flow moves to form interconnection balls operation 140. In form interconnection balls operation 140, interconnection balls 2558 are formed on second circuit pattern 3134.

In accordance with an alternative embodiment, electronic component 2040 is mounted with an adhesive to first surface 202L of dielectric layer 202 in a wirebond configuration similar to that illustrated in FIG. 25A. In accordance with this wirebond configuration, bond pads 2046 are electrically connected to protruding post 2818 by bond wires in a manner similar to that illustrated in FIG. 25A.

Figure 36:
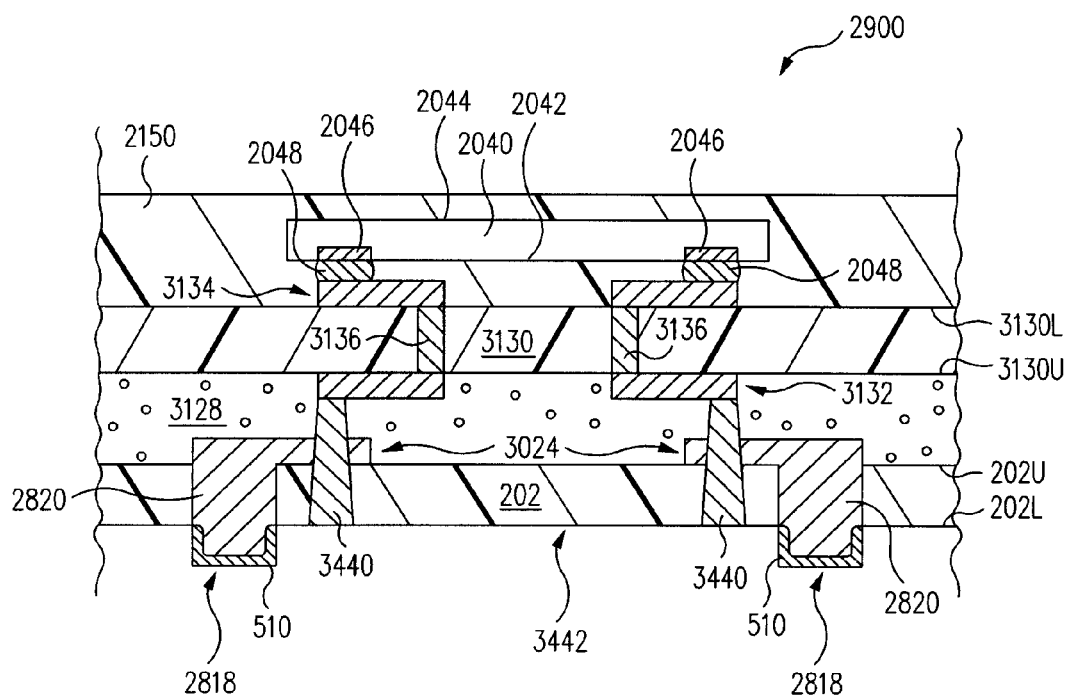
FIG. 36 is a cross-sectional view of the protruding post substrate package of FIG. 34 at a later stage during fabrication in accordance with another embodiment In the following description, the same or similar elements are labeled with the same or similar reference numbers.

FIG. 36 is a cross-sectional view of protruding post substrate package 2900 of FIG. 34 at a later stage during fabrication in accordance with another embodiment. Referring now to FIGS. 26 and 36 together, from form blind vias in blind via apertures operation 2622, flow moves to attach electronic component operation 134.

In attach electronic component operation 134, protruding post substrate 3442 is inverted from the view of FIG. 34 and electronic component 2040 is attached to protruding post substrate 3442. More particularly, electronic component 2040 is mounted to second circuit pattern 3134 in a flip chip configuration. More particularly, bond pads 2046 are physically and electrically connected to second circuit pattern 3134 by flip chip bumps 2048. In one embodiment, an underfill is applied between active surface 2042 of electronic component 2040 and second surface 3130L of dielectric core 3130 and around flip chip bumps 2048.

From attach electronic component operation 134, flow moves to encapsulate operation 136. In encapsulate operation 136, electronic component 2040 is encapsulated in encapsulant 2150. More particularly, encapsulant 2150 encapsulates second surface 3130L of dielectric core 3130 and electronic component 2040. In accordance with this embodiment, encapsulant 2150 fills the space between active surface 2042 of electronic component 2040 and second surface 3130L of dielectric core 3130. Performance of encapsulate operation 136 completes protruding post substrate package 2900 as illustrated in FIG. 36.

In accordance with an alternative embodiment, electronic component 2040 is mounted with an adhesive to second surface 3130L of dielectric core 3130 in a wirebond configuration similar to that illustrated in FIG. 22A. In accordance with this wirebond configuration, bond pads 2046 are electrically connected to second circuit pattern 3134 by bond wires in a manner similar to that illustrated in FIG. 22A.

Although formation of individual packages is described above, in other embodiments, a plurality of packages are formed simultaneously in an array or strip using the methods as described above. The array or strip is singulated to singulate the individual packages from one another.

Further, although the packages described above include a single electronic component, it is to be understood that other packages can be formed having more than one electronic component, e.g., two or more stacked electronic components.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming a protruding post substrate package comprising:
   applying a dielectric layer to a carrier;
   forming via apertures in the dielectric layer;
   creating carrier cavities in the carrier using the dielectric layer as a mask;
   lining the carrier cavities with a first metal, the first metal being selectively etchable compared to the carrier;
   filling the carrier cavities with a second metal, wherein the first metal and the second metal form protruding posts;
   forming a seed layer over a second surface of the dielectric layer, on sidewalls of the via apertures, and on the second metal;
   filling the via apertures with a circuit pattern metal to form vias in the via apertures, the vias being electrically connected to the protruding posts, wherein the circuit pattern metal covers the seed layer;
   forming a circuit pattern electrically connected to the vias comprising:
      applying a resist to the circuit pattern metal;
      patterning the resist to expose circuit pattern portions of the circuit pattern metal;
      plating a circuit pattern buildup layer on the circuit pattern portions;
      removing the resist to expose exposed portions of the circuit pattern metal; and
   removing the exposed portions of the circuit pattern metal and underlying portions of the seed layer using the circuit pattern buildup layer as a mask; and
   removing the carrier, wherein the protruding posts comprising the first metal protrude outward from a first surface of the dielectric layer.

2. A method of forming a protruding post substrate package comprising:
   applying a dielectric layer to a carrier;
   forming via apertures in the dielectric layer;
   creating carrier cavities in the carrier using the dielectric layer as a mask;
   lining the carrier cavities with a first metal, the first metal being selectively etchable compared to the carrier;
   filling the carrier cavities with a second metal, wherein the first metal and the second metal form protruding posts;
   forming a seed layer over a second surface of the dielectric layer, on sidewalls of the via apertures, and on the second metal;
   filling the via apertures with a circuit pattern metal to form vias in the via apertures, the vias being electrically connected to the protruding posts, wherein the circuit pattern metal covers the seed layer;
   forming a circuit pattern electrically connected to the vias comprising:
      applying a resist to the circuit pattern metal;
      patterning the resist to expose exposed portions of the circuit pattern metal; and
      removing the exposed portions of the circuit pattern metal and underlying portions of the seed layer to form the circuit pattern; and
   removing the carrier, wherein the protruding posts comprising the first metal protrude outward from a first surface of the dielectric layer.

3. The method of claim 2 further comprising: removing the resist.

4. The method of claim 1 further comprising:
   applying a buildup dielectric layer to the second surface of the dielectric layer and on the circuit pattern.

5. The method of claim 4 further comprising:
forming via apertures in the buildup dielectric layer to expose lands of the circuit pattern.

6. The method of claim 5 further comprising forming vias in the via apertures of the buildup dielectric layer, the vias in the via apertures of the buildup dielectric layer being electrically connected to the circuit pattern.

7. The method of claim 6 further comprising electrically connecting bond pads of an electronic component to the vias in the via apertures of the buildup dielectric layer.

8. The method of claim 7 further comprising encapsulating the electronic component in an encapsulant.

9. A method of forming a protruding post substrate package comprising:
applying a dielectric layer to a carrier;
forming via apertures in the dielectric layer;
creating carrier cavities in the carrier using the dielectric layer as a mask;
lining the carrier cavities with a first metal, the first metal being selectively etchable compared to the carrier;
filling the carrier cavities with a second metal, wherein the first metal and the second metal form protruding posts;
forming a seed layer over a second surface of the dielectric layer, on sidewalls of the via apertures, and on the second metal;
filling the via apertures with a circuit pattern metal to form vias in the via apertures, the vias being electrically connected to the protruding posts;
forming a circuit pattern electrically connected to the vias;
applying a buildup dielectric layer to the second surface of the dielectric layer and on the circuit pattern;
forming via apertures in the buildup dielectric layer to expose lands of the circuit pattern;
forming vias in the via apertures of the buildup dielectric layer, the vias in the via apertures of the buildup dielectric layer being electrically connected to the circuit pattern;
removing the carrier, wherein the protruding posts comprising the first metal protrude outward from a first surface of the dielectric layer; and
electrically connecting bond pads of an electronic component to the protruding posts.

10. The method of claim 9 further comprising encapsulating the electronic component in an encapsulant.

11. The method of claim 10 further comprising forming interconnection balls on the vias in the via apertures of the buildup dielectric layer.

12. A method of forming a protruding post substrate package comprising:
applying a dielectric layer to a carrier;
forming via apertures in the dielectric layer;
creating carrier cavities in the carrier using the dielectric layer as a mask;
lining the carrier cavities with a first metal to form protruding posts in the carrier, the first metal being selectively etchable compared to the carrier;
forming a circuit pattern coupled to the protruding posts;
mounting a circuit pattern buildup structure to the dielectric layer and the circuit pattern by an adhesive,
removing the carrier, wherein the protruding posts protrude outward from the dielectric layer;
forming blind via apertures extending through the dielectric layer, through the circuit pattern, through the adhesive to expose a first circuit pattern of the circuit pattern buildup structure; and
forming blind vias in the blind via apertures, the blind vias electrically connecting the circuit pattern with the first circuit pattern.

* * * * *